United States Patent
Nuimura

(10) Patent No.: US 10,917,228 B2
(45) Date of Patent: Feb. 9, 2021

(54) PHASE ADJUSTMENT CONTROL DEVICE, ARRAY ANTENNA DEVICE, ANTENNA MEASURING DEVICE, AND METHOD FOR ADJUSTING PHASE OF PHASED ARRAY ANTENNA

(71) Applicant: Mitsubishi Electric Corporation, Chiyoda-ku (JP)

(72) Inventor: Shuji Nuimura, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/495,343

(22) PCT Filed: Mar. 29, 2018

(86) PCT No.: PCT/JP2018/013351
§ 371 (c)(1),
(2) Date: Sep. 18, 2019

(87) PCT Pub. No.: WO2018/181764
PCT Pub. Date: Oct. 4, 2018

(65) Prior Publication Data
US 2020/0389285 A1 Dec. 10, 2020

(30) Foreign Application Priority Data
Mar. 31, 2017 (JP) .................. 2017-071432

(51) Int. Cl.
*H04B 7/02* (2018.01)
*H04L 7/00* (2006.01)
(Continued)

(52) U.S. Cl.
CPC ......... *H04L 7/0091* (2013.01); *H04B 7/0613* (2013.01); *H04B 17/318* (2015.01)

(58) Field of Classification Search
CPC ....... H04L 7/0091; H04L 1/0618; H04L 1/06; H04L 25/0204; H04B 17/318; H04B 7/0613; H04B 7/0417; H04B 7/0669
(Continued)

(56) References Cited

U.S. PATENT DOCUMENTS

| 2008/0153433 | A1* | 6/2008 | Pallonen | H03F 3/211 |
| | | | | 455/90.2 |
| 2013/0201003 | A1* | 8/2013 | Sabesan | G06K 19/0723 |
| | | | | 340/10.1 |
| 2020/0091608 | A1* | 3/2020 | Alpman | H04B 7/0639 |

FOREIGN PATENT DOCUMENTS

| JP | 1-37882 B2 | 8/1989 |
| JP | 3-165103 A | 7/1991 |

(Continued)

OTHER PUBLICATIONS

Extended European Search Report dated Feb. 25, 2020 in Patent Application No. 18778006.9, 10 pages.
(Continued)

Primary Examiner — Don N Vo
(74) Attorney, Agent, or Firm — Oblon, McClelland, Maier & Neustadt, L.L.P.

(57) ABSTRACT

Calibration is performed such that phase references of element antennas match, without radiating radio waves from all element antennas at the same time. A plurality of element antennas are divided into element antenna groups, and operating element antenna sets, each including at least two element antenna groups including a measured element antenna group, are set to an operating state in order by a phase adjustment controller. The phase adjustment controller includes: an element-electric-field calculation circuit that uses a plurality of received power levels of radio waves radiated with different phases by changing the phases of element antennas and that calculates in-set phase differ-
(Continued)

ences, in an operating element antenna set, among element electric field vectors generated by the element antennas the phases of which are changed; and a phase-difference calculator that uses element electric field vectors of the element antennas for which the element electric field vectors are calculated by using a plurality of different operating element antenna sets and that calculates phase differences among the element electric field vectors of the element antennas included in the different operating element antenna sets.

23 Claims, 7 Drawing Sheets

(51) Int. Cl.
*H04B 7/06* (2006.01)
*H04B 17/318* (2015.01)

(58) Field of Classification Search
USPC ........................................ 375/267
See application file for complete search history.

(56) References Cited

FOREIGN PATENT DOCUMENTS

| JP | 11-68443 A | 3/1999 |
| JP | 2001-201525 A | 7/2001 |
| JP | 2002-243783 A | 8/2002 |
| JP | 4864285 B2 | 2/2012 |
| JP | 2012-112812 A | 6/2012 |
| JP | 2013-106118 A | 5/2013 |

OTHER PUBLICATIONS

Shitikov A. M., et al, "Multi-Element PAA Calibration with Rev Method" International Conference on Antenna theory and Techniques, XP 055660164, Dec. 9, 2003, pp. 761-764.

International Search Report dated May 15, 2018 in PCT/JP2018/013351 filed Mar. 29, 2018.

* cited by examiner (A)　　　　　　　　(B)

PHASE ADJUSTMENT CONTROL DEVICE, ARRAY ANTENNA DEVICE, ANTENNA MEASURING DEVICE, AND METHOD FOR ADJUSTING PHASE OF PHASED ARRAY ANTENNA

TECHNICAL FIELD

The present disclosure relates to an array antenna device including a phased array antenna used for wireless power transmission.

BACKGROUND ART

There has been proposed a space solar power system (SSPS) with which power is transmitted to the ground from a large-scale solar power generator installed in space. For this purpose, research and development of a wireless power transmission system for transmitting and receiving the power by a radio wave in a frequency band such as microwaves are being advanced.

In recent years, development of elemental technologies of the SSPS has progressed, and many studies on a system that performs long-distance, large-scale power transmission toward a remote island and a flying object have been conducted.

In the long-distance, large-scale power transmission system, a phased array antenna in which a large number of element antennas are linearly or planarly arranged is used. The phased array antenna has a feature that a beam shape and a beam radiation direction are variable by adjusting a phase of each element antenna. The phased array antenna is not necessary to be driven mechanically, but can change an orientation at high speed. The phases of the plurality of element antennas are necessary to be adjusted in order to transmit the power in an intended direction efficiently using the phased array antenna. That is, the plurality of element antennas are necessary to be calibrated such that phase references of the plurality of element antennas are matched.

In a conventional antenna measuring device for adjusting the phases of a plurality of element antennas, a high-frequency signal transmitted from a transmitter is radiated from a pickup antenna into space. The radiated high-frequency signal is received by the plurality of element antennas. In this reception state, a variable phase shifter is controlled to change a phase shift setting value of each element antenna sequentially by a control circuit. A measurement calculation circuit measures a ratio of a maximum value and a minimum value of the combined output of all the element antennas and the phase shift setting value at which the maximum value is obtained, and calculates an amplitude and the phase of each element antenna. Such a method is called a rotating element electric field vector (REV) method (see, for example, PTD 1).

In the conventional antenna measuring device configured as described above, in order to obtain an element electric field vector of the element antenna, it is necessary to set all the element antennas to an operating state (the state in which the radio wave is radiated), and to change the phase shift setting value of only the variable phase shifter connected to the element antenna.

CITATION LIST

Patent Document

PTD 1: Patent Publication No. 1-37882

SUMMARY OF INVENTION

Technical Problem

In long-distance, large-scale power transmission systems, a transmitting antenna and a receiving antenna are typically divided in order to minimize a system size. In order to adjust the phase of the phased array antenna of the transmitting antenna, it is necessary to obtain the element electric field vector of each element antenna in a state in which the transmitting antenna radiates the radio wave. In addition, an antenna installed on the ground is required to be calibrated in an installation environment because a surrounding environment affects the antenna installed on the ground. However, when all the element antennas are set to the operating state in an uncalibrated state, there is a problem that safety may not be secured, for example, there is a possibility of causing radio wave exposure or a fault of a wireless communication device. In the calibration, it is necessary to guarantee the radiation of a radio wave being conformable to a radio law and a radio protection guideline established by the government as a safety standard for the use of an electromagnetic wave.

On the other hand, the safety can be ensured by radiating a radio wave with small power. However, the calibration cannot be performed due to degradation of an S/N ratio or an intended beam cannot be formed due to degradation of calibration accuracy, which result in a problem in that there exists a possibility that the safety cannot be secured during the power transmission.

An object of the present disclosure is to obtain an array antenna device, an antenna measuring device, and a method for adjusting a phase of a phased array antenna for performing calibration such that the phase references of element antennas constituting the phased array antenna are matched without setting all the element antennas to the operating state at the same time.

Solution to Problem

A phase adjustment control device for a phased array antenna according to the present disclosure includes: a received-power obtainer for obtaining a received power level being a measured level of power of a radio wave received by a receiving antenna disposed at a position where the receiving antenna can receive the radio wave radiated by the phased array antenna. The phased array antenna includes: a plurality of element antennas for radiating a transmission signal from a transmitter as a radio wave; a plurality of operation switches for switching between an operating state in which the element antenna radiates the radio wave and a non-operating state in which the element antenna does not radiate the radio wave, the operation switch being provided for each of the element antennas or for every several element antennas; and a plurality of variable phase shifters for changing a phase of the transmission signal inputted to the element antenna, the variable phase shifter being provided for each of the element antennas or for every several element antennas.

The phase adjustment control device further includes: a radiation controller for controlling the plurality of operation switches according to an operating element antenna set such that the element antenna included in an operating element antenna set is set to the operating state while the element antenna not included in the operating element antenna set is set to the non-operating state, the operating antenna set being each of a plurality of operating element antenna sets and being determined to be part of the plurality of element antennas in units of the element antenna being switched between the operating state and the non-operating state by one operation switch; an in-set phase-difference calculator for calculating an in-set phase difference being a phase difference between element electric field vectors, each of the element electric field vectors being generated by the radio wave, the radio wave being radiated by the element antennas included in a phase measurement element antenna set and received by the receiving antenna in a state in which the radiation controller controls the plurality of operation switches according to each of the plurality of operating element antenna sets, the phase measurement element antenna set being a set of the element antennas including at least part of the operating element antenna set, by changing the phase of the transmission signal inputted to the element antenna included in the phase measurement element antenna set being a set of the element antennas including at least part of the element antennas included in the operating element antenna set and using the received power levels at a plurality of different phase change amounts; and a phase-difference calculator for calculating a phase difference between the element electric field vectors being generated by the element antennas included in the different phase measurement element antenna sets based on the plurality of in-set phase differences calculated for the plurality of phase measurement element antenna sets, each of the plurality of operating element antenna sets being determined so as to include the element antenna common to another operating element antenna set, each of the phase measurement element antenna sets corresponding to each of the plurality of operating element antenna sets being determined so as to include the element antenna common to another phase measurement element antenna set.

An antenna measuring device according to the present disclosure includes: a receiving antenna for receiving a radio wave radiated by a phased array antenna; and a received power level measurer for measuring a received power level. The received power level is a measured level of power of the radio wave received by the receiving antenna. The phased array antenna includes: a plurality of element antennas for radiating a transmission signal from a transmitter as a radio wave; a plurality of operation switches for switching between an operating state in which the element antenna radiates the radio wave and a non-operating state in which the element antenna does not radiate the radio wave, the operation switch being provided for each of the element antennas or for every several element antennas; and a plurality of variable phase shifters for changing a phase of the transmission signal inputted to the element antenna, the variable phase shifter being provided for each of the element antennas or in every several element antennas. The antenna measuring device further includes: a radiation controller for controlling the plurality of operation switches according to an operating element antenna set such that the element antenna included in an operating element antenna set is set to the operating state while the element antenna not included in the operating element antenna set is set to the non-operating state, the operating element antenna set being each of a plurality of operating element antenna sets and being determined to be part of the element antennas in units of the element antenna being switched between the operating state and the non-operating state by one operation switch; an in-set phase-difference calculator for calculating an in-set phase difference being a phase difference between element electric field vectors each of the element electric field vectors being generated by the radio wave, the radio wave being radiated by each of the element antennas included in a phase measurement element antenna set and received by the receiving antenna in a state in which the radiation controller controls the plurality of operation switches according to each of the plurality of operating element antenna sets, the phase measurement element antenna set being a set of the element antennas including at least part of the operating element antenna set, by changing the phase of the transmission signal inputted to the element antenna included in the phase measurement element antenna set and by using the received power levels at a plurality of different phase change amounts; and a phase-difference calculator for calculating a phase difference between the element electric field vectors, the element electric field vectors being generated by the element antennas included in the different phase measurement element antenna sets based on the plurality of in-set phase differences calculated for the plurality of phase measurement element antenna sets, each of the plurality of operating element antenna sets being determined so as to include the element antenna common to another operating element antenna set, each of the plurality of phase measurement element antenna sets corresponding to each of the plurality of operating element antenna sets being determined so as to include the element antenna common to another phase measurement element antenna set.

A phased array antenna that is an object applied with a method for adjusting a phase of the phased array antenna according to the present disclosure includes: a plurality of element antennas for radiating a transmission signal from a transmitter as a radio wave; a plurality of operation switches for switching between an operating state in which the element antenna radiates the radio wave and a non-operating state in which the element antenna does not radiate the radio wave, the operation switch being provided for each of the element antennas or for every several element antennas; and a plurality of variable phase shifters for changing a phase of the transmission signal inputted to the element antenna, the variable phase shifter being provided for each of the element antennas or for every several element antennas.

The phase adjustment method includes: a radiation control step of controlling the plurality of operation switches according to an operating element antenna set such that the element antenna included in an operating element antenna set is set to the operating state while the element antenna not included in the operating element antenna set is set to the non-operating state, the operating antenna set being each of a plurality of operating element antenna sets and being determined to be part of the plurality of element antennas in units of the element antenna being switched between the operating state and the non-operating state by one operation switch; an in-set phase difference calculation step of calculating an in-set phase difference being a phase difference between element electric field vectors, each of the element electric field vectors being generated by the radio wave, the radio wave being radiated by each of the element antennas included in a phase measurement element antenna set and received by the receiving antenna, in a state in which the plurality of operation switches are controlled in the radiation control step according to each of the plurality of operating element antenna sets, the phase measurement element antenna set being a set of the element antennas including at least part of the operating element antenna set, by changing the phase of the transmission signal inputted to the element antenna included in the phase measurement element antenna set, and using received power levels being measured levels of power of the radio waves received by the receiving antenna disposed at a position where the receiving antenna can receive the radio wave radiated by phased array antenna at a plurality of different phase change amounts; and a phase difference calculation step of calculating a phase difference between the element electric field vectors, the element electric field vectors being generated by the element antennas included in the different phase measurement element antenna sets based on the plurality of in-set phase differences calculated for the plurality of phase measurement element antenna sets, each of the plurality of operating element antenna sets being determined so as to include the element antenna common to another operating element antenna set, each of the plurality of phase measurement element antenna sets corresponding to each of the plurality of operating element antenna sets being determined so as to include the element antenna common to another phase measurement element antenna set.

Advantageous Effects of Invention

According to the present disclosure, the phase references of the element antennas constituting the phased array antenna can be matched without setting all the element antennas to the operating state at the same time.

DESCRIPTION OF EMBODIMENTS

First Embodiment

Figure 1:
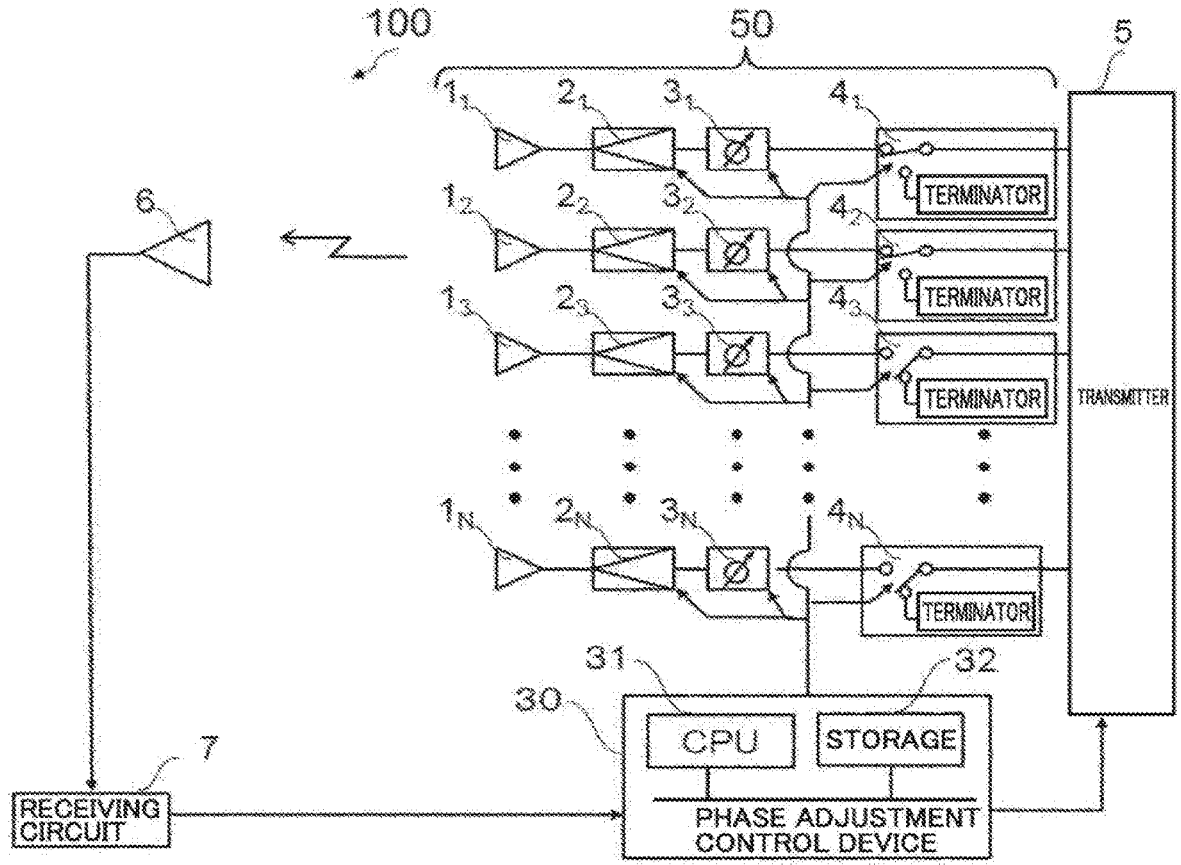
FIG. 1 is a block diagram illustrating an electrical configuration of an array antenna device according to a first embodiment of the present disclosure.

FIG. 1 is a block diagram illustrating an electrical configuration of an array antenna device according to a first embodiment of the present disclosure. As illustrated in FIG. 1, in a phased array antenna 50, a plurality (N) of element antennas $1_n$ (n=1, 2, ..., N) is arrayed on an antenna surface. A power amplifier $2_n$ is connected to each element antenna $1_n$. A variable phase shifter $3_n$ is connected to an input terminal of power amplifier $2_n$. A switching circuit $4_n$ is connected to an input terminal of variable phase shifter $3_n$. A transmitter 5 is connected to an input terminal of switching circuit $4_n$. In the case where the element antenna is not necessary to be specified, the element antenna may be described like an element antenna 1. The same expressions are used for other components.

Power amplifier $2_n$, variable phase shifter 3, switching circuit $4_n$, and transmitter 5 are controlled by a phase adjustment control device 30. Phase adjustment control device 30 is implemented with a computer including a CPU 31 and a storage 32. Storage 32 stores a program executed by CPU 31, data used for processing, data obtained as a result of processing, and the like. Storage 32 is a semiconductor memory such as a flash memory, and a hard disk. Storage 32 includes a volatile storage device and a non-volatile storage device.

Transmitter 5 generates a high-frequency transmission signal. The transmission signal is distributed by a distribution circuit (not illustrated), and is inputted to N switching circuits $4_n$. Switching circuit $4_n$ switches whether or not the transmission signal is inputted to variable phase shifter $3_n$. Variable phase shifter $3_n$ changes a phase of the input transmission signal by a phase change amount instructed from phase adjustment control device 30. The transmission signal whose phase is changed is outputted from variable phase shifter $3_n$, and is inputted to power amplifier $2_n$. Power amplifier $2_n$ amplifies the input transmission signal to the intended power. Power amplifier $2_n$ is an amplifier that increases amplitude of the transmission signal to be inputted to element antenna $1_n$. The amplified transmission signal is spatially radiated as a radio wave from element antenna $1_n$ toward a receiving antenna 6. A plurality of sets of element antennas $1_n$, power amplifiers $2_n$, variable phase shifters $3_n$, and switching circuits $4_n$ constitute phased array antenna 50. N element antennas $1_n$ have the same configuration. N power amplifiers $2_n$, N variable phase shifters $3_n$, and N switching circuits $4_n$ each have the same configuration.

Element antenna $1_n$ in an operating state means that element antenna $1_n$ radiates a radio wave. In a non-operating state, element antenna $1_n$ does not radiate the radio wave. Switching circuit $4_n$ is an operation switch that switches between the operating state in which element antenna $1_n$ radiates the radio wave and the non-operating state in which element antenna $1_n$ does not radiate the radio wave. One switching circuit $4_n$ may switch the operating state or the non-operating state of the plurality of element antennas $1_n$.

Variable phase shifter $3_n$ rotates the phase by a predetermined phase rotation step width. When phase resolution is represented by an integer of a predetermined number of bits, the step width is determined according to the number of bits. For example, in the case of a 5-bit phase shifter, the step width is $360°/2^5=11.25°$.

As illustrated in FIG. 1, receiving antenna 6 is installed opposite to element antenna 1. Receiving antenna 6 is required to be disposed at a position where receiving antenna 6 can receive the radio wave radiated by phased array antenna 50. A receiving circuit 7 that measures a received power level being power of the radio wave received by the receiving antenna is connected to receiving antenna 6. The received power level measured by receiving circuit 7 is inputted to phase adjustment control device 30.

Receiving antenna 6, receiving circuit 7, and phase adjustment control device 30 constitute an antenna measuring device. Phased array antenna 50 and phase adjustment control device 30 constitute an array antenna device 100. The antenna measuring device measures the phase, or phase and amplitude of an element electric field vector being generated by the radio wave radiated by element antenna 1 included in phased array antenna 50 and received by receiving antenna 6.

Figure 2:
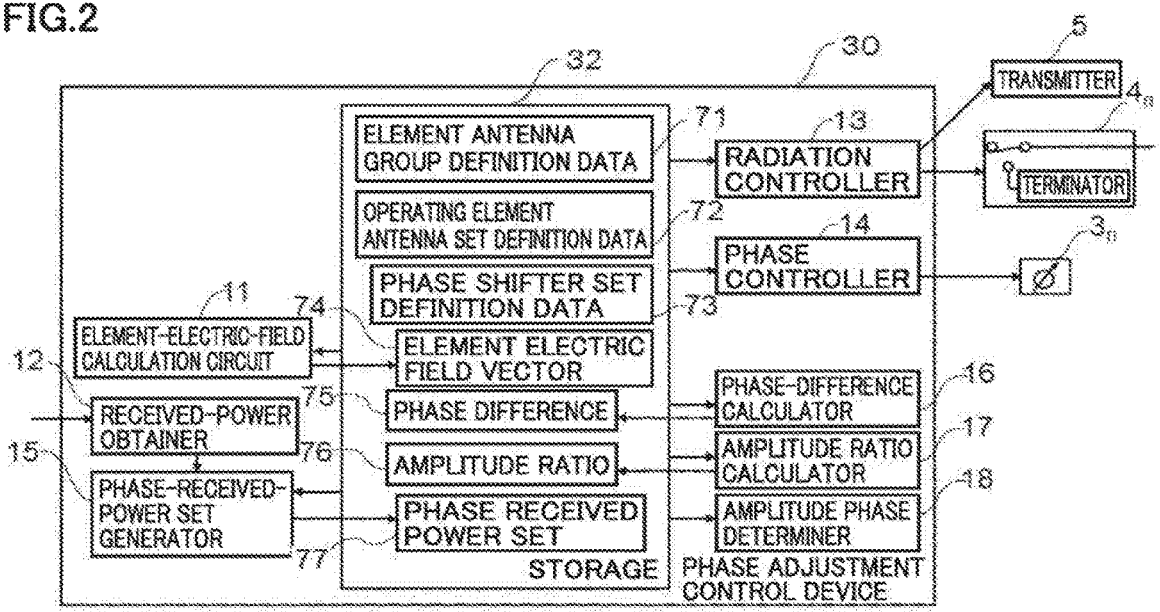
FIG. 2 is a block diagram illustrating a functional configuration of a phase adjustment control device included in the array antenna device of the first embodiment.

As illustrated in FIG. 2, phase adjustment control device 30 includes an element-electric-field calculation circuit 11, a received-power obtainer 12, a radiation controller 13, a phase controller 14, a phase-received-power set generator 15, a phase-difference calculator 16, an amplitude ratio calculator 17, an amplitude phase determiner 18, and a storage 32. A dedicated program stored in storage 32 is executed by CPU 31, thereby implementing received-power obtainer 12, radiation controller 13, phase controller 14, phase-received-power set generator 15, phase-difference calculator 16, amplitude ratio calculator 17, and amplitude phase determiner 18.

Element-electric-field calculation circuit 11 calculates the amplitude and phase of an element electric field (element electric field vector) of each element antenna $1_n$ from the inputted received power level and the phase change amount instructed to variable phase shifter 3 from which the transmission signal is inputted to element antenna $1_n$ in the operating state when the received power level is obtained.

Element-electric-field calculation circuit 11 measures the element electric field vector of each element antenna $1_n$ by a rotating element electric field vector (REV) method. In the REV method, the phase of the transmission signal inputted to one element antenna $1_j$ in the operating state is changed, and the received power level received by receiving antenna 6 is measured in each changed phase. The received power level changes in a cosine curve with respect to the phase change amount instructed to element antenna $1_j$ in which the phase is changed. An element electric field vector $E_j$ of element antenna $1_j$ in which the phase is changed is calculated from the phase change amount at which the cosine curve takes a peak and a ratio between a maximum value and a minimum value of the received power level. The element electric field vector of element antenna $1_j$ is repeatedly obtained by changing the phase of element antenna $1_j$ one by one, thereby calculating element electric field vectors $E_n$ of all element antennas $1_n$ in the operating state.

Storage 32 stores element antenna group definition data 71, operating element antenna set definition data 72, phase shifter set definition data 73, an element electric field vector 74, a phase difference 75, an amplitude ratio 76, and a phase received power set 77, and the like. An element antenna group 10 (illustrated in FIG. 3) is a unit determining the set of element antennas 1 that are operated at the same time. Element antenna group definition data 71 is data defining element antenna group 10. Operating element antenna set definition data 72 is data representing the set of element antennas 1 that are operated at the same time. Phase shifter set definition data 73 is data representing the set of variable phase shifters 3 that change the phase at the same time to obtain the element electric field vector. Element electric field vector 74 is obtained for each element antenna 1. Phase received power set 77 is data used to obtain element electric field vector 74.

Figure 3:
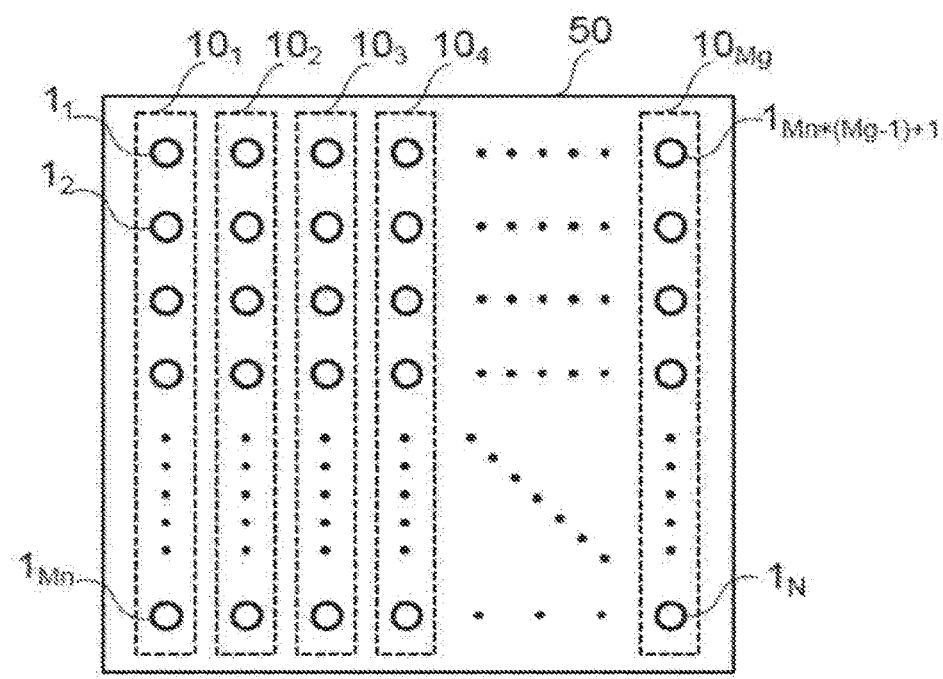
FIG. 3 is a view illustrating an example of an element antenna group in the array antenna device of the first embodiment.

Element antenna group definition data 71 defines how to divide all element antennas 1 into a plurality of element antenna groups 10 without duplication. FIG. 3 illustrates an example of element antenna group 10. FIG. 3 is a view illustrating an example of the element antenna group in the array antenna device of the first embodiment. In FIG. 3, one "o" represents one element antenna 1. Although element antenna 1 is represented by "o", "o" does not mean that a radiation surface (opening surface) of element antenna 1 has a circular shape.

In the example illustrated in FIG. 3, among element antennas 1 arranged into a matrix in vertical and horizontal directions, the set of element antennas 1 of one column arranged in the vertical direction is element antenna group 10. It is assumed that the number of element antenna groups 10 is Mg. It is assumed that the number of element antennas 1 included in each element antenna group 10 is equal, and is Mn. The number Mg of element antenna groups 10 is required to be three or more. The number Mn of element antennas 1 included in each element antenna group 10 is required to be two or more. The number of element antennas 1 included in element antenna group 10 may be changed depending on element antenna group 10. Element antenna group 10 may be the set of element antennas 1 that are not physically adjacent to each other. Element antenna group 10 is the set of element antennas 1 determined as a virtual group.

An operating element antenna set 20 is a plurality of element antenna groups 10 that are operated at the same time. Operating element antenna set definition data 72 is data defining operating element antenna sets 20 in units of element antenna group 10 with two element antenna groups 10 that are operated at the same time. Because all element antennas 1 are forbidden to be set to the operating state at the same time, element antennas 1 are set to the operating state while being divided into the plurality of operating element antenna sets 20. Operating element antenna set definition data 72 defines the plurality of operating element antenna sets 20 that are sets of part of element antennas 1 to the operating state such that all element antennas 1 are operated at least once. The number of element antennas 1 included in operating element antenna set 20 is determined such that the power of the radiated radio wave becomes less than or equal to an allowable value.

In the first embodiment, the number Md of operating element antenna sets 20 is smaller than the number Mg of element antenna groups 10 by one. That is, Md=Mg−1 is obtained. Each operating element antenna set 20 consists of two element antenna groups 10. A combination of two element antenna groups 10 varies for each operating element antenna set 20. Two element antenna groups 10 are included in one operating element antenna set 20. Element antenna groups 10 other than the two element antenna groups 10 are included in two operating element antenna sets 20. When a union of element antenna groups 10 included in two operating element antenna sets 20 including a common element antenna group 10 is repeatedly taken, the union becomes a set of all element antenna groups 10 after all operating element antenna sets 20 are processed. Element antennas 1 included in operating element antenna set 20 are set to the operating state in the order defined by operating element antenna set definition data 72.

Phase shifter set definition data 73 is data defining a set of variable phase shifters 3 (variable phase shifter set) in which the phase is changed at the same time for each operating element antenna set 20. The phases of one or the set of variable phase shifters 3 are repeatedly changed at the same time in order to obtain the element electric field vector of element antenna 1. Variable phase shifters 3 included in the variable phase shifter sets are different from each other. All variable phase shifters 3 are included in any one of the variable phase shifter sets. There may be variable phase shifter 3 included in a plurality of variable phase shifter sets. In this embodiment, the variable phase shifter set in which the phase is changed one by one by variable phase shifters 3 corresponding to element antennas 1 set to the operating state at the same time is defined by phase shifter set definition data 73. Instead of using phase shifter set definition data 73, a program may be executed such that variable phase shifter 3 is extracted one by one from the set of variable phase shifters 3 corresponding to element antennas 1 included in operating element antenna set 20.

Phase received power set 77 is a set of variable phase shifter 3 that changes the phase, the phase change amount that is the amount changing the phase, and the received power level that is measured by receiving circuit 7 while the phase of the variable phase shifter 3 is changed. Element-electric-field calculation circuit 11 calculates element electric field vector 74 of element antenna 1, to which the transmission signal whose phase is adjusted by variable phase shifter 3 is inputted, using the plurality of phase received power sets 77 for each variable phase shifter 3. In the case where the phase is changed at the same time by the plurality of variable phase shifters 3, the phase is changed by the same amount using all variable phase shifters 3 that change the phase, and the set of variable phase shifters 3 is recorded in phase received power set 77. Storage 32 that stores phase received power set 77 is a phase received power set storage that stores the phase received power set that is a set of the variable phase shifter set, the phase change amount, and the received power level for each operating element antenna set 20.

Received-power obtainer 12 obtains the received power level measured by receiving circuit 7. Radiation controller 13 processes operating element antenna set 20 in the order defined by operating element antenna set definition data 72. Radiation controller 13 controls switching circuit 4 such that element antennas 1 included in operating element antenna set 20 being processed are set to the operating state, and such that other element antennas 1 are set to the non-operating state. Phase controller 14 selects, according to phase shifter set definition data 73, variable phase shifter 3 that changes the phase of the transmission signal inputted to the element antenna 1 in the operating state. The phase of selected variable phase shifter 3 is controlled so as to be rotated by 360 degrees in each step width. Phase-received-power set generator 15 generates phase received power set 77 that is the set of the received power level obtained every time phase controller 14 rotates the phase, the phase change amount that is the amount rotating the phase, and variable phase shifter 3 that rotates the phase, and stores phase received power set 77 in storage 32.

Element-electric-field calculation circuit 11 calculates an element electric field vector $En$ of each element antenna $1_n$, namely, a phase shift $\Delta n$ and an amplitude ratio $rn$ of each element antenna $1_n$ from the plurality of phase received power sets 77 by, for example, the method described in PTD 1. Element-electric-field calculation circuit 11 stores calculated element electric field vector 74 in storage 32.

Here, the following variables are defined.

$En$: the element electric field vector of element antenna $1_n$ corresponding to variable phase shifter $3n$ that rotates the phase $E0$: a composite electric field vector in a reference state that is a state in which the phases and amplitudes of all element antennas $1_n$ included in operating element antenna set 20 being processed are not adjusted $\Delta n$: the phase difference between $En$ and $E0$.

$rn$: the amplitude ratio of $En$ to $E0$. $rn=|En|/|E0|$

Phase difference $\Delta n$ is a phase difference between element electric field vector $En$ and composite electric field vector $E0$ that are used commonly as a reference (phase reference). A phase difference $(\Delta n1-\Delta n2)$ between element antenna $1_{n1}$ and element antenna $1_{n2}$ included in the same operating element antenna set 20 can also be calculated from $\Delta n$. Element-electric-field calculation circuit 11 is an in-set phase-difference calculator that calculates an in-set phase difference. The in-set phase difference is a phase difference of element electric field vectors $En$ of element antennas $1_n$ included in one operating element antenna set 20.

Amplitude ratio $rn$ is an amplitude ratio between an amplitude $|En|$ of element electric field vector $En$ and an amplitude $|E0|$ of $E0$ that is a common amplitude reference. An amplitude ratio $rn1/rn2$ between element antenna $1_{n1}$ and element antenna $1_{n2}$ included in the same operating element antenna set 20 can also be calculated from $rn$. Element-electric-field calculation circuit 11 is an in-set amplitude ratio calculator that calculates in-set amplitude ratio $rn$. The in-set amplitude ratio $1_n$ is an amplitude ratio of element electric field vectors $En$ of element antennas $1_n$ included in operating element antenna set 20.

Phase-difference calculator 16 calculates the phase difference between element electric field vectors of element antennas 1 included in different operating element antenna sets 20. When the in-set phase difference are determined for the plurality of operating element antenna sets 20 including common element antenna 1, phase-difference calculator 16 calculates the phase difference between the element electric field vectors of element antennas 1 that are not common. Alternatively, when the in-set phase difference can be determined for all operating element antenna sets 20, phase-difference calculator 16 calculates the phase difference between the element electric field vectors of all element antennas 1. Similarly, amplitude ratio calculator 17 calculates the amplitude ratio between the element electric field vectors of element antennas 1 included in different operating element antenna sets 20. Calculated phase difference 75 and amplitude ratio 76 are stored in storage 32.

In consideration of the phase difference and the amplitude ratio of element electric field vectors, amplitude phase determiner 18 determines a phase shift adjustment value (phase change amount) for each variable phase shifter 3 and an amplitude adjustment value (amplification factor) for each power amplifier 2. Amplitude phase determiner 18 determines the phase shift adjustment value and the amplitude adjustment value such that phased array antenna 50 radiates the radio wave in an intended radiation beam pattern. Amplitude phase determiner 18 is a phase change amount determiner that determines the phase change amount of the variable phase shifter from the phase difference of the element electric field vectors of the element antennas. Amplitude phase determiner 18 is also an amplification factor determiner that determines the amplification factor of the amplifier from the amplitude ratio of the element electric field vectors of the element antennas.

Phase difference 75 between element electric field vectors $E_n$ generated by all element antennas $1_n$ is stored in a control device (if different from phase adjustment control device 30) that determines a signal inputted to each variable phase shifter $3_n$ or phased array antenna 50. Stored phase difference 75 is used to obtain the intended beam pattern when amplitude phase determiner 18 determines the phase of each element antenna $1_n$. The same holds true for amplitude ratio 76 between element electric field vectors $E_n$. However, sometimes amplitude ratio 76 is stored in power amplifier 2.

With reference to FIGS. 4 to 7, a method in which phase-difference calculator 16 calculates the phase difference is described. In this case, it is assumed that phase differences $\Delta jA$ (j=1 to 6) of element electric field vector Ej with respect to composite electric field vector $E_{OA}$ are calculated for an operating element antenna set $20_A$ including element antennas $1_{jA}$ of NO=1 to 6. It is also assumed that phase difference $\Delta jB$ (j=4 to 9) of element electric field vector Ej with respect to composite electric field vector $E_{OB}$ are calculated for an operating element antenna set $20_B$ including element antennas $1_{jB}$ of NO=4 to 9. Phase-difference calculator 16 stores calculated phase difference 75 in storage 32, and converts calculated phase difference 75 into the element electric field vector of which phase reference is composite electric field vector $E_{OA}$.

Figure 4:
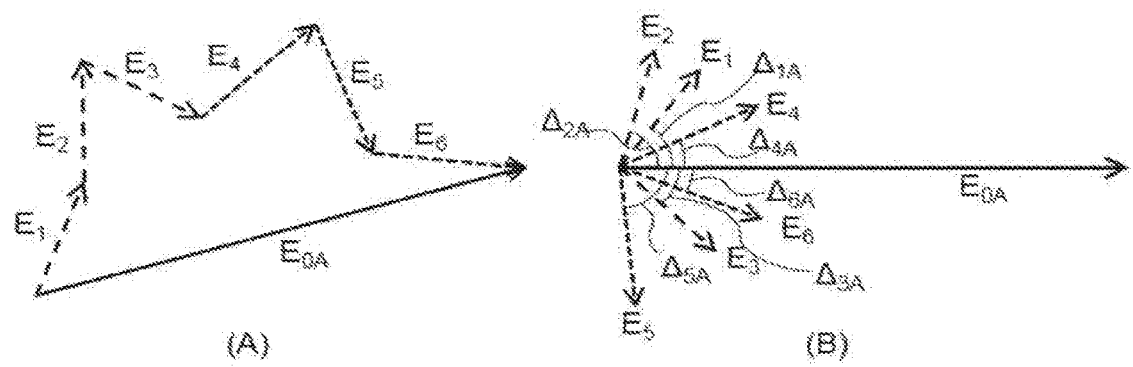
FIG. 4 is a view illustrating an example of calculation of an in-set phase difference in a first operating element antenna set in the array antenna device of the first embodiment.
Figure 5:
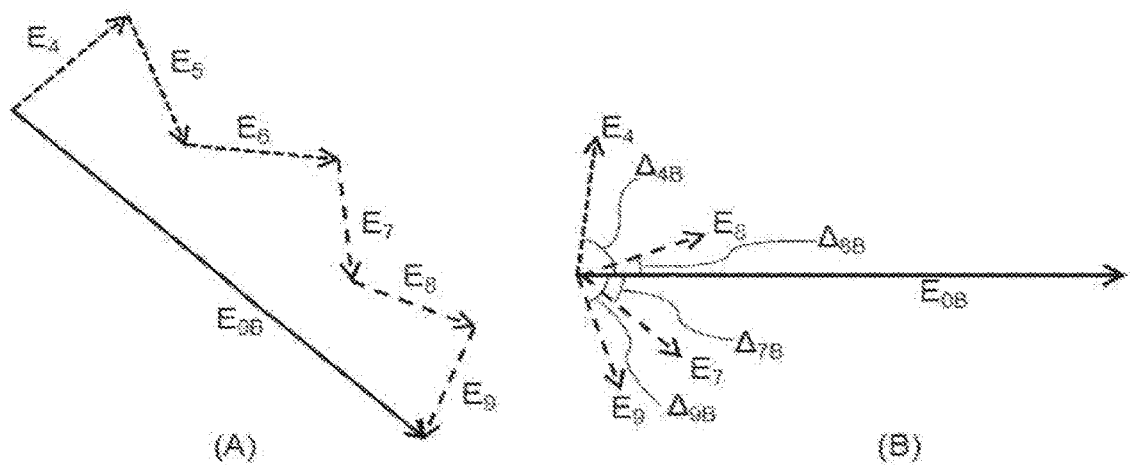
FIG. 5 is a view illustrating an example of the calculation of the in-set phase difference in a second operating element antenna set in the array antenna device of the first embodiment.

FIGS. 4 and 5 are views illustrating examples of the calculation of the in-set phase difference in the two operating element antenna sets in the array antenna device of the first embodiment. FIG. 4(A) illustrates a state in which composite electric field vector $E_{OA}$ is combined. FIG. 4(B) illustrates phase differences $\Delta jA$ (j=1 to 6) between composite electric field vector $E_A$ and an element electric field vector EjA. FIG. 4(B) illustrates the state in which composite electric field vector $E_{OA}$ as a reference turns to the right. FIG. 5(A) illustrates a state in which composite electric field vector $E_{OB}$ is combined. FIG. 5(B) illustrates phase differences $\Delta jB$ (j=4 to 9) of composite electric field vector $E_{OB}$ and an element electric field vector EjB.

A method for calculating a phase difference $\tau$ between $E_{OA}$ and $E_{OB}$ is described. Since $\Delta jA = \Delta jB + \tau$ (j=4 to 6) are required to be satisfied, $\tau$ is determined such that the following error function F is minimized.

$$F = (\Delta 4A - \Delta 4B - \tau)^2 + (\Delta 5A - \Delta 5B - \tau)^2 + (\Delta 6A - \Delta 6B - \tau)^2 \quad (1)$$

In order to minimize error function F expressed by the equation (1), $\tau$ is required to be determined as follows. For example, $(\Delta 4A - \Delta 4B)$ is a phase difference between composite electric field vectors $E_{OA}$ and $E_{OB}$ that are obtained from the element electric field vector generated by element antenna 14. In FIGS. 4 and 5, element antennas 1 common to operating element antenna sets $20_A$ and $20_B$ are element antennas $1_4$, $1_5$, $1_6$. Equation (2) means that an average of the phase difference between composite electric field vectors $E_{OA}$ and $E_{OB}$ that can be measured for each element antenna 1 common to operating element antenna sets $20_A$ and $20_B$ are taken as phase difference $\tau$.

$$\tau = (\Delta 4A - \Delta 4B + \Delta 5A - \Delta 5B + \Delta 6A - \Delta 6B)/3 \quad (2)$$

Phase difference $\Delta j$ between $E_{OA}$ and each element electric field vector Ej (j=1 to 9) is determined as follows using $\tau$ determined with equation (2). In equation (3B), $(\Delta jB + \tau)$ is a phase difference between element electric field vector EjB calculated for operating element antenna set $20_B$ and composite electric field vector $E_{OA}$. Thus, equation (3B) means that, with respect to element antennas $1_4$, $1_5$, $1_6$, element electric field vectors EjA and EjB calculated twice are converted into those based on the same reference and the average is taken.

$$\Delta j = \Delta jA \quad (3A)$$
$$j = 1 \text{ to } 3$$

$$\Delta j = (\Delta jA + \Delta jB + \tau)/2 \quad (3B)$$
$$j = 4 \text{ to } 6$$

$$\Delta j = \Delta jB + \tau \quad (3C)$$
$$j = 7 \text{ to } 9$$

More simply, for example, the phase difference between composite electric field vectors A and B in one element antenna 1 may be determined as follows. In this case, $\Delta 5B$ and $\Delta 6B$ are not necessary to be calculated. Element electric field vector is calculated again for at least one element antenna $1_n$ of which element electric field vector is already calculated.

$$\tau = \Delta 4A - \Delta 4B \quad (4)$$

$$\Delta j = \Delta jA \quad (5A)$$
$$j = 1 \text{ to } 6$$

$$\Delta j = \Delta jB + \tau \quad (5B)$$
$$j = 7 \text{ to } 9$$

Figure 6:
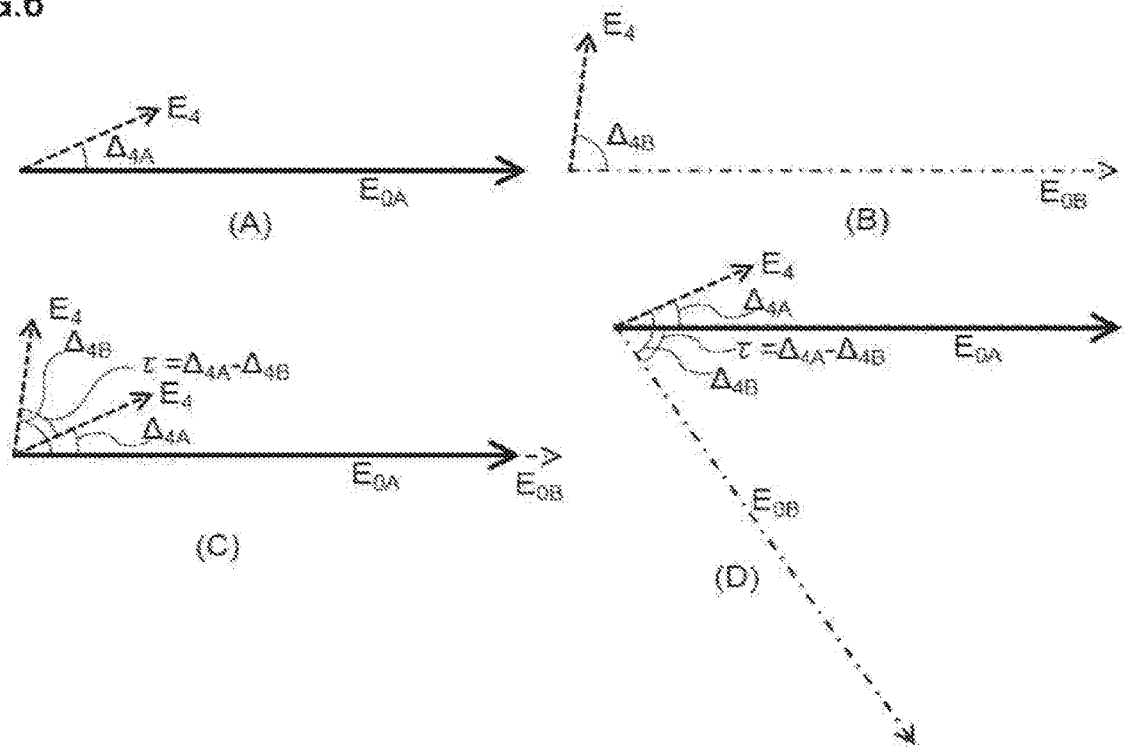
FIG. 6 is a view illustrating an example of a method for calculating a phase difference of element electric field vectors in the array antenna device of the first embodiment.
Figure 7:
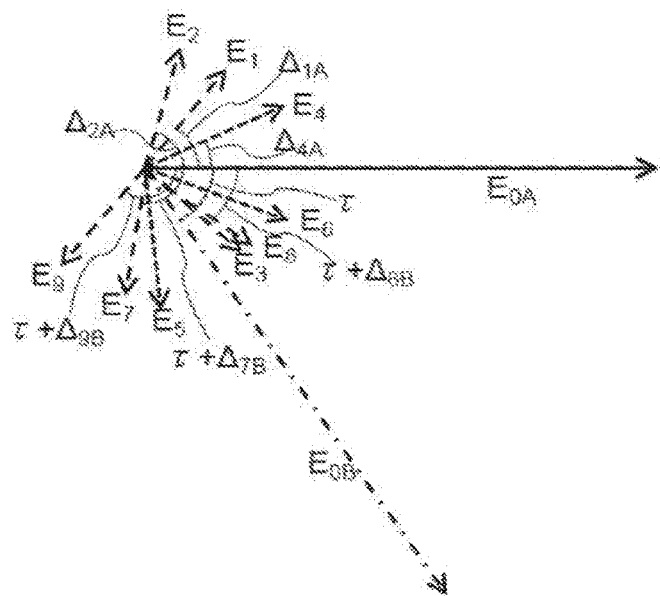
FIG. 7 is a view illustrating an example of the calculation result of the phase difference of the element electric field vectors in the array antenna device of the first embodiment.

FIG. 6 is a view illustrating an example of a method for calculating the phase difference of the element electric field vectors in the array antenna device of the first embodiment. FIG. 6(A) illustrates a relationship between $E_{OA}$ and $E_4$. FIG. 6(B) illustrates a relationship between $E_{OB}$ and $E_4$. $E_{OA}$ as a reference is indicated by a thick line, and $E_{OB}$ is indicated by an alternate long and short dash line. FIG. 6(C) illustrates a view in which $E_{OA}$ and $E_{OB}$ are disposed at the same position. As can be seen from FIG. 6(C), two $E_4$ that should originally be identical have a difference. An angular difference of this deviation is $\tau = \Delta 4A - \Delta 4B$ with respect to $E_{OA}$. In FIG. 6(C), an angle in a counterclockwise direction is set to positive. Because $\tau$ is a clockwise angle, $\tau < 0$ is obtained. FIG. 6(D) illustrates a state in which $E_{OB}$ is rotated by a rotation amount of $\tau = \Delta 4A - \Delta 4B$ such that two $E_4$ are matched. FIG. 7 is a view illustrating an example of the calculation result of the phase difference of the element electric field vectors in the array antenna device of the first embodiment. As can be seen from FIG. 7, Ej (j=7 to 9) is rotated by the rotation amount of $\tau$, and $\Delta j$ (j=7 to 9) becomes an angle with respect to $E_{OA}$.

In equation (3C) or (5B), the phase of the element electric field vector calculated for operating element antenna set $20_B$ is corrected to be the phase with respect to the reference calculated for operating element antenna set $20_A$ using $\tau$. $\tau$ can be considered as a correction value for correcting the phase of the element electric field vector calculated for operating element antenna set $20_B$ to the phase with respect to the reference calculated for operating element antenna set $20_A$. Operating element antenna set 20 is required to include element antenna $1_n$ in which the element electric field vector is not calculated yet before the processing of the operating element antenna set 20. In this case, the phase difference of element antenna $1_n$ in which the element electric field vector is calculated at the first time is calculated using equation (3C) or (5B). Consequently, the number of element antennas $1_n$ in which the phase difference is calculated with respect to the common reference increases.

The amplitude ratio can be calculated similarly to the phase difference when the amplitude is expressed by a logarithmic value (for example, decibel (dB)). Amplitude phase determiner 18 calculates an amplitude ratio $\xi=10*\log_{10}(|E_{OA}|/|E_{OB}|)$ between $E_{OA}$ and $E_{OB}$ and an amplitude ratio cj with respect to $|E_{OA}|$ from $cn=10*\log_{10}(rn)$ that is a value obtained by taking the logarithm of amplitude ratio rn. In operating element antenna set $20_A$, it is assumed that the amplitude ratio cjA (j=1 to 6) of element electric field vector Ej to composite electric field vector $E_{OA}$ are calculated. In operating element antenna set $20_B$, it is assumed that the amplitude ratio cjB (j=4 to 9) of element electric field vector Ej to composite electric field vector $E_{OB}$ are calculated. Amplitude ratio calculator 17 stores calculated amplitude ratio 76 in storage 32, and converts calculated amplitude ratio 76 into the element electric field vector of which amplitude reference is composite electric field vector $E_{OA}$.

Similarly to the phase difference, amplitude ratio $\xi$ between $E_{OA}$ and $E_{OB}$ and amplitude ratio cj of element electric field vector Ej (j=1 to 9) to $E_{OA}$ can be calculated as follows.

$$\xi = (c4A - c4B + c5A - c5B + c6A - c6B)/3 \quad (6)$$

$$cj = cjA \quad (7A)$$
$$j = 1 \text{ to } 3$$

$$cj = (cjA + cjB + \xi)/2 \quad (7B)$$
$$j = 4 \text{ to } 6$$

$$cj = cjB + \xi \quad (7C)$$
$$j = 7 \text{ to } 9$$

More simply, for example, it may be determined as follows.

$$\xi = c4A - c4B \quad (8)$$

$$cj = cjA \quad (9A)$$
$$j = 1 \text{ to } 6$$

$$cj = cjB + \xi \quad (9B)$$
$$j = 7 \text{ to } 9$$

In equation (7C) or (9B), the amplitude ratio of the element electric field vector calculated for operating element antenna set 20B is corrected to the amplitude ratio with respect to the reference calculated for operating element antenna set $20_A$ using $\xi$. $\xi$ can be considered as a correction value for correcting the amplitude ratio of the element electric field vector calculated for operating element antenna set $20_B$ to the amplitude ratio with respect to the reference for the element electric field vector calculated for operating element antenna set $20_A$.

Figure 8:
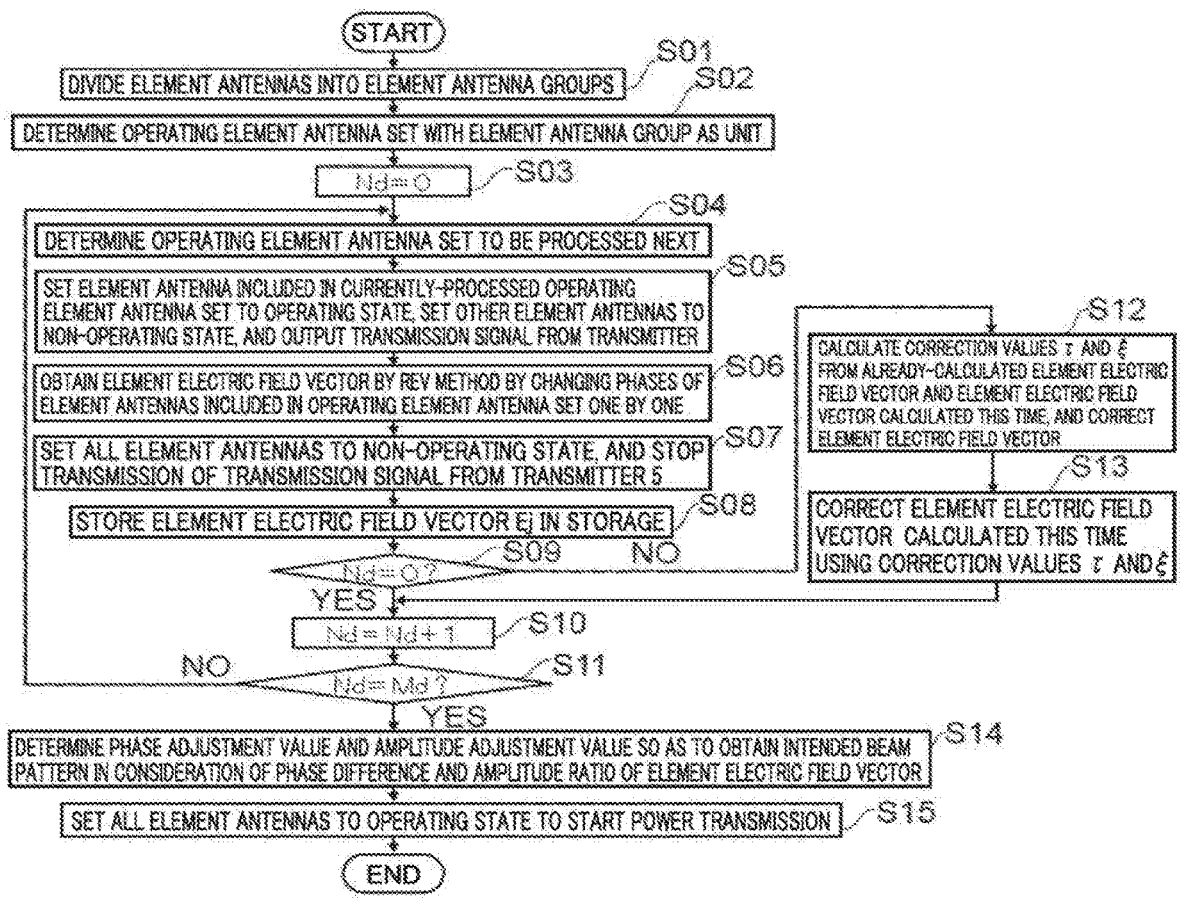
FIG. 8 is a flowchart illustrating an example of processing until phase references of all element antennas are matched to transmit power using all the element antennas in the array antenna device of the first embodiment.

The operation is described. FIG. 8 is a flowchart illustrating an example of processing until phase references of all element antennas are matched to transmit power using all element antennas in the array antenna device of the first embodiment. FIG. 8 can also be considered as a flowchart illustrating a method for adjusting the phase of the phased array antenna.

Steps S01 and S02 are performed beforehand. In step S01, N element antennas 1 are divided into element antenna groups 10 as illustrated in FIG. 3. In this embodiment, as an example, it is assumed that in (Mn*Mg) element antennas 1 of Mn rows and Mg columns, one element antenna group 10 is generated for Mn element antennas 1 arrayed in the vertical direction. In FIG. 3, element antenna groups $10_1$, $10_2$, ..., $10_{Mg}$ are numbered from the left.

In step S02, operating element antenna set 20 is determined with element antenna group 10 as a unit. Operating element antenna set definition data 72 representing determined operating element antenna set 20 is stored in storage 32. Here, operating element antenna sets 20 are expressed with two element antenna groups $10_n$ that are set to the operating state at the same time enclosed in parentheses like $(10_1, 10_2)$ or the like. When operating element antenna sets $20_n$ are expressed in order from operating element antenna set $20_1$ executed at first, for example, it is expressed as follows.

$20_1 = (10_1, 10_2)$
$20_2 = (10_2, 10_3)$
$20_3 = (10_3, 10_4)$
...
$20_{Mg-1} = (10_{Mg-1}, 10_{Mg})$

The processing in steps S01 and S02 is an operating element antenna set selection procedure for selecting a plurality of operating element antenna sets 20 from all element antennas 1.

Figure 9:
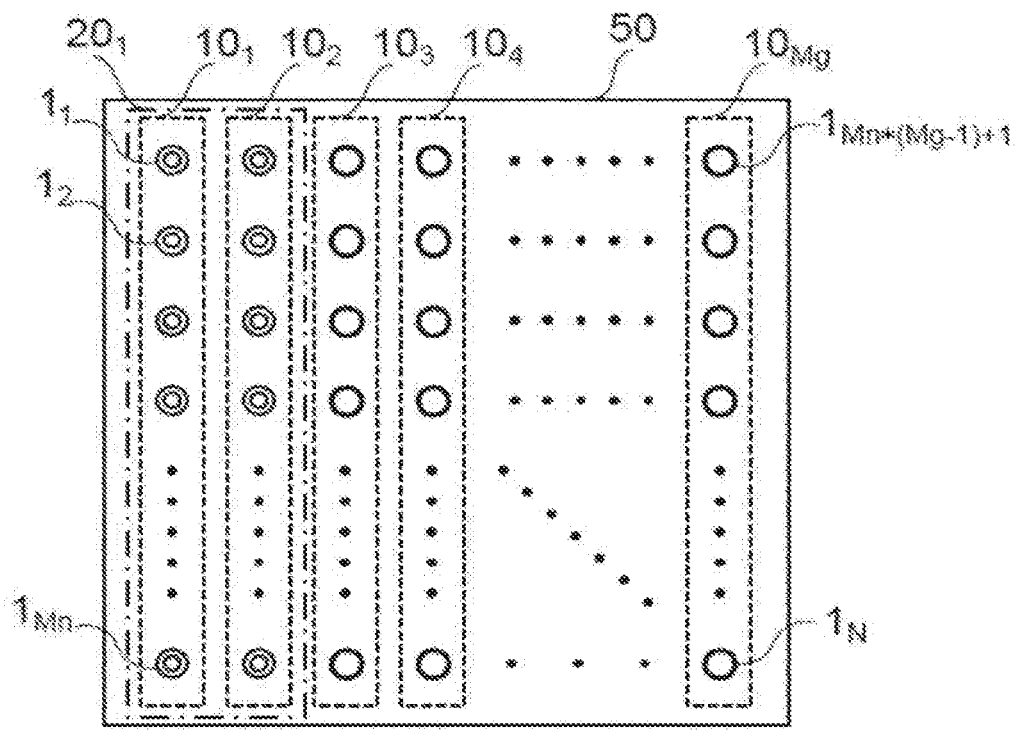
FIG. 9 is a view illustrating an operating state and a non-operating state of the element antenna in the operating element antenna set processed at a first time in the array antenna device of the first embodiment.
Figure 10:
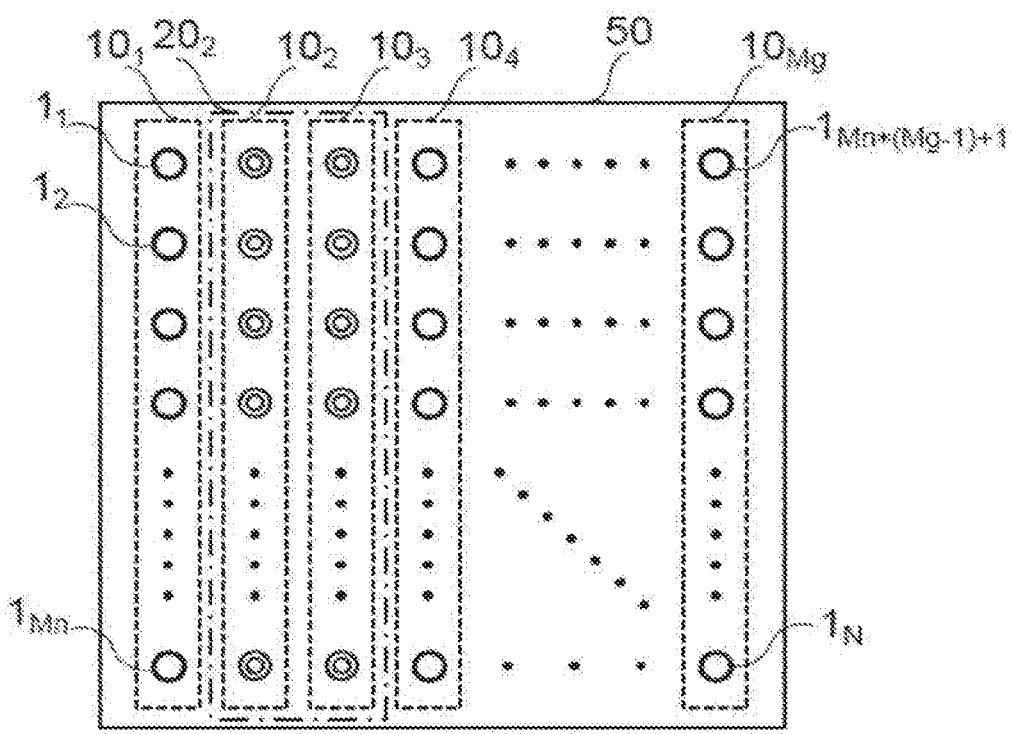
FIG. 10 is a view illustrating the operating state and the non-operating state of the element antenna in the operating element antenna set processed at a second time of the array antenna device of the first embodiment.

In the above case, first operating element antenna set $20_1$ is illustrated in FIG. 9. In FIG. 9, element antenna 1 in the operating state (the radio wave is radiated) is represented with a double circle "⊙", and element antenna 1 in the non-operating state (the radio wave is not radiated) is represented with a white circle "o". Second operating element antenna set $20_2$ is illustrated in FIG. 10. Operating element antenna set $20_n$ each including two columns are obtained by selecting two columns from the left while one of the two columns overlaps one of next two columns. FIGS. 9 and 10 are views illustrating the operating state and the non-operating state of the element antenna in operating element antenna sets $20_1$, $20_2$ processed at the first and second times, respectively, in the array antenna device of the first embodiment. In FIGS. 9 and 10, operating element antenna set $20_n$ is displayed while being surrounded by an alternate long and short dash line.

The processing of dividing N element antennas 1 into Mg element antenna groups 10 in step S01 may be programmed and automated in advance, or may manually be performed by the user. For the manual division, the phase adjustment control device includes a human interface such as a user setting screen displayed on a display terminal or the like. Additionally, for the manual performance, desirably the phase adjustment control device has a function of checking whether or not a constraint such as the allowable radiation power level is satisfied.

Not performing S02 that is processing of determining the operating element antenna set, the user may manually determine operating element antenna set 20 to be processed next by selecting element antenna group 10 each time. In this case, it is preferable to provide a function of assisting the user by presenting information necessary or useful for the user to determine operating element antenna set 20. For example, operating element antenna set 20 is required to be determined so as to include both element antenna group 10 in which the element electric field vector is already calculated and element antenna group 10 in which the element electric field vector is not yet calculated. For this reason, element antenna group 10 in which the element electric field vector is already calculated and element antenna group 10 in which the element electric field vector is not yet calculated are presented to the user to be distinguished easily.

In step S03, the number Nd of already-processed operating element antenna sets 20 is initialized to zero. In step S04, operating element antenna set 20 to be processed next is determined by referring to operating element antenna set definition data 72. Specifically, operating element antenna set 20 that is located at the foremost among unprocessed operating element antenna sets 20 is taken out. In step SOS, radiation controller 13 controls element antenna 1 included in currently-processed operating element antenna set 20 to be operated, and element antenna 1 not included in operating element antenna set 20 not to be operated. Transmitter 5 starts transmitting the transmission signal.

Step S05 is a radiation control procedure of controlling a plurality of switching circuits 4 such that element antennas 1 included in operating element antenna set 20 are set to the operating state while element antennas 1 not included in operating element antenna set 20 are set to the non-operating state according to each of a plurality of operating element antenna sets 20 that are each a set of part of element antennas 1, the plurality of operating element antenna sets 20 being determined in units of element antenna 1 in which the operating state or the non-operating state is switched at the same time by switching circuit 4.

In step S06, the phases of the element antennas included in the operating element antenna set are changed one by one, and the element electric field vector is obtained by the REV method. Specifically, element antennas 1 in the operating state are selected one by one. The phase shift setting value (phase change amount) of variable phase shifter 3 corresponding to selected element antenna 1 is set in each step width. Consequently, the phase of the radio wave radiated by element antenna 1 is rotated. The received power level of the signal received by receiving antenna 6 is measured at each of the phase shift setting values. Phase received power set 77 is generated and stored in storage 32 for each phase shift setting value of variable phase shifter 3. Phase received power set 77 is the set of variable phase shifters 3 that change the phase, the phase shift setting value, and the received power level of the signal received by receiving antenna 6. The element electric field vector of element antenna 1 corresponding to variable phase shifter 3 that has changed the phase is calculated using the plurality of stored phase received power sets 77 by the REV method. The set of element antennas that calculate the element electric field vector among element antennas included in operating element antenna set 20 is referred to as a phase measurement element antenna set. The phase measurement element antenna set is a set of the element antennas including at least part of element antennas 1 included in operating element antenna set 20.

Step S06 is an in-set phase difference calculation procedure for calculating an in-set phase difference. The in-set phase difference is the phase difference between the element electric field vectors generated by the radio wave, which is radiated by each element antenna 1 included in the phase measurement element antenna set and received by receiving antenna 6. In the in-set phase difference calculation procedure, the in-set phase difference is calculated using the plurality of received power levels. The received power level is a measured level of the power of the radio wave received by receiving antenna 6 disposed at a position where the receiving antenna can receive the radio wave radiated by the phased array antenna 50. The phase of the transmission signal inputted to element antenna 1 included in the phase measurement element antenna set that is a set of the element antennas including at least part of element antennas 1 included in operating element antenna set 20 is changed with a plurality of different phase change amounts in a state in which radiation controller 13 controls the plurality of switching circuits 4 according to each of the plurality of operating element antenna sets 20. Step S06 is also a phase control procedure for controlling variable phase shifter 3 with a plurality of different phase change amounts such that variable phase shifters 3 included in the variable phase shifter set change the phase of the transmission signal by the same phase change amount in the state in which radiation controller 13 controls the plurality of switching circuits 4 according to corresponding operating element antenna set 20 corresponding to the variable phase shifter set which includes variable phase shifters 3 being different from each other, the variable phase shifter set being the set of variable phase shifters 3 provided corresponding to element antennas 1 included in each of operating element antenna sets 20.

In step S07, radiation controller 13 sets all element antennas 1 to the non-operating state. Transmitter 5 stops the transmission of the transmission signal.

The processing of determining one element antenna 1 that rotates the phase in step S06 is a variable phase shifter set generation procedure for generating a plurality of variable phase shifter sets such that variable phase shifters 3 included in each of the variable phase shifter sets are different from each other, the variable phase shifter set being a set of variable phase shifters 3 that change the phase of element antenna 1 provided according to element antenna 1 included in operating element antenna set 20.

In step S06, the processing of generating a plurality of phase received power sets each of which is a set of the received power level measured at each of the plurality of phase shift setting values set to variable phase shifter 3, the variable phase shifter set, and the phase shift setting values, and storing the plurality of phase received power sets in storage 32 is a phase received power set generation procedure. The processing of calculating the element electric field vector for each element antenna 1 by the REV method is an in-set phase difference calculation procedure for calculating the in-set phase difference that is the phase difference between the element electric field vectors generated by each element antenna 1 included in the phase measurement element antenna set. The processing of calculating the element electric field vector for each element antenna 1 by the REV method is also an in-set amplitude ratio calculation procedure for calculating an in-set amplitude ratio that is an amplitude ratio between the element electric field vectors generated by each element antenna 1 included in the phase measurement element antenna set.

The element electric field vector is stored in storage 32 in step S08. In step S09, it is checked whether first operating element antenna set 20 is currently being processed (Nd=0?). First operating element antenna set 20 (YES in S09) is currently processed, Nd=Nd+1 is set in step S10. In step S11, whether or not all operating element antenna sets 20 are processed is checked (Nd=Md?). When all operating element antenna sets 20 are not processed (NO in S11), the processing returns to step S04.

Steps S04 to S08 are also performed on the second and subsequent operating element antenna sets 20. Since it is not first operating element antenna set 20 (NO in S09), the processing goes to step S12. In step S12, correction values τ and ξ are calculated from the already-calculated element electric field vector and the element electric field vector calculated this time, and the element electric field vector is corrected. Specifically, in the element antenna group in which the element electric field vector is calculated at the second time in step S06, the two element electric field vectors are obtained for each element antenna 1. In the element antenna in which the two element electric field vectors are calculated, phase difference τ between the two element electric field vectors is calculated using equation (2) or (4), and the amplitude ratio ξ is calculated using equation (6) or (8). When T is calculated using equation (2), the phase of the element electric field vector of each element antenna 1 is corrected using equation (3B). When ξ is calculated using equation (6), the amplitude ratio is corrected using equation (7B). In FIG. 10, element antenna 1 included in element antenna group $10_2$ is element antenna 1 in which the element electric field vector is calculated at the second time.

In step S13, the element electric field vector calculated at the first time is corrected with correction values τ and ξ. Specifically, in the element antenna group in which the element electric field vector is calculated at the first time, the phase of the element electric field vector calculated this time is corrected using equation (3C) or (5B). The amplitude ratio is corrected using equation (7C) or (9B). Then, the processing goes to S10. Equation (3C) or (5B) is an equation with which the phase of the element electric field vector calculated for current operating element antenna set 20 is corrected to the value based on the composite electric field vector in first-time operating element antenna set $20_1$ using correction value r. Equation (7C) or (9B) is an equation with which the amplitude ratio of the element electric field vector calculated at this time is corrected to the value based on the composite electric field vector in first-time operating element antenna set $20_1$ using correction value ξ.

Thus, for example, in FIG. 10, element antenna 1 included in element antenna group $10_3$ is element antenna 1 in which the element electric field vector is calculated at the first time. After the element electric field vectors are calculated for operating element antenna set $20_2$ in FIG. 10, the element electric field vectors can be calculated by arranging the phase reference to be the same for element antennas 1 included in element antenna groups $10_1$, $10_2$, and $10_3$.

The processing in step S12 is a phase difference calculation procedure for calculating the phase difference between the element electric field vectors generated by element antennas 1 included in different phase measurement element antenna sets based on the in-set phase difference calculated for the plurality of phase measurement element antenna sets including common element antennas. The processing in step S12 is also an amplitude ratio calculation procedure for calculating the amplitude ratio of the element electric field vectors generated by element antennas 1 included in the different phase measurement element antenna sets based on the in-set amplitude ratio calculated for the plurality of phase measurement element antenna sets.

When all operating element antenna sets 20 are processed (YES in S11), amplitude phase determiner 18 determines the phase adjustment value for each variable phase shifter 3 and the amplitude adjustment value for each power amplifier 2 such that the intended radiation beam pattern is obtained in consideration of the phase difference and the amplitude ratio of element electric field vectors in step S14.

The processing in step S14 is a phase change amount determination procedure for determining the phase change amount that is changed by variable phase shifter 3 corresponding to element antenna 1 from the phase difference of the element electric field vectors generated by each element antenna. The processing in step S14 is also an amplification factor determination procedure for determining the amplification factor used by power amplifier 2 corresponding to element antenna 1 from the amplitude ratio of the element electric field vector generated by each element antenna.

In step S15, radiation controller 13 sets all element antennas 1 to the operating state, and causes transmitter 5 to start the transmission of the transmission signal.

The element electric field vector of each element antenna is obtained repeatedly by the REV method while part of the element antennas are set to the operating state. The element electric field vector is calculated while the element antenna in which the element electric field vector is already calculated is included in part of the element antennas that are set to the operating state. Consequently, the element electric field vectors of all the element antennas can be set to the value for the common reference without setting all the element antennas to the operating state at the same time. Because the element electric field vector of each element antenna is obtained with respect to the common reference, the phase adjustment value and the amplitude adjustment value for each element antenna 1 can properly be determined to generate the intended beam pattern and the intended beam pattern is generated.

The number of some element antennas that are set to the operating state in order to obtain the element electric field vector by the REV method is set to be equal, so that the phase reference of each element antenna can efficiently be calibrated within a range of allowable radiation power level. The number of element antennas that are set to the operating state may not be set to be equal. When the power of the radio wave radiated by the largest number of element antennas being set to the operating state is less than or equal to the allowable radiation power level, the number of element antennas that are set to the operating state may not be equal.

By applying the processing in steps S4 to S14 of FIG. 8 to all element antenna groups 10, the amplitude adjustment value of power amplifier 2 of phased array antenna 50 and the phase adjustment value of variable phase shifter 3 of phased array antenna 50 can be calculated and set while the phase references of all element antennas 1 are matched. That is, the phase and amplitude of the element electric field vector of each element antenna 1 can be calibrated. In phased array antenna 50 calibrated in this way, the radio wave can be radiated into space with the intended beam pattern.

According to this embodiment, each element antenna 1 included in at least two element antenna groups 10 is calibrated by the REV method such that the phase reference is matched while at least one element antenna group 10 is overlapped using the plurality of element antenna groups 10 that are determined such that a safety standard such as the allowable radiation power level is complied with. Consequently, phase adjustment control device 30 can calibrate the phase of the element electric field vector generated by each element antenna with respect to the common electric field vector. The processing of calculating the element electric field vector can efficiently be performed by defining element antenna group 10 in advance. Even if all element antennas 1 are not set to the operating state, the calibration can be performed such that the phase reference and the amplitude reference are matched with a degree of accuracy similar to the case where all element antennas 1 are set to the operating state. Only the phase reference may be calibrated, and the amplitude reference may not be calibrated.

Array antenna device 100, being installed outdoors and radiating the radio wave actually, can be measured the phase and amplitude of an element electric field vector generated by each element antenna. Array antenna device 100 can accurately be calibrated while including an influence of a surrounding environment.

Phase adjustment control device 30 can radiate the radio wave within the range of allowable radiation power level conforming to the safety standard, such as a radio law and a radio wave protection guideline established by the government as the safety standard for use of the electromagnetic wave. Thus, in the array antenna device, the antenna measuring device, and the method for adjusting the phase of the phased array antenna of the present disclosure, electromagnetic wave exposure harmful to a human body and occurrence of a failure to surrounding wireless communication devices can be avoided.

Figure 11:
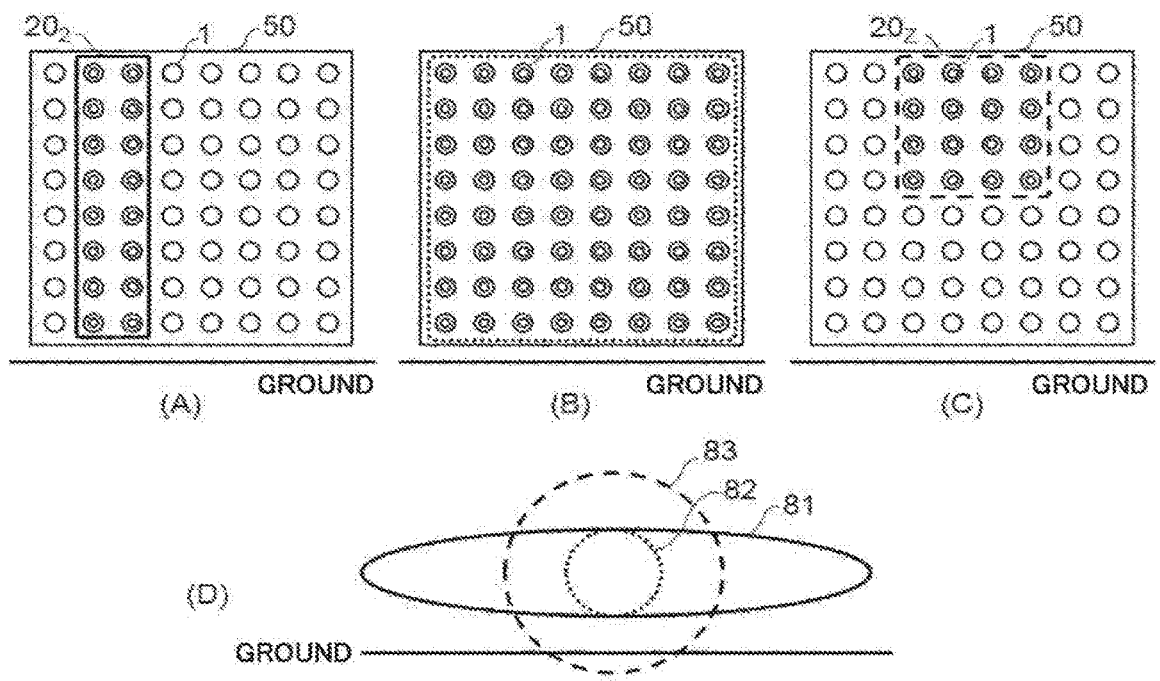
FIG. 11 is a view illustrating an example in which a beam shape can be elongated in a horizontal direction by the operating element antenna set used in the array antenna device of the first embodiment.

A sum of the radiation surfaces (opening surfaces) of the element antenna 1 in the operating state is referred to as a combined radiation surface (combined opening surface). In array antenna device 100, element antenna group 10 is determined such that the combined radiation surface has a rectangular shape elongated in the vertical direction. With reference to FIG. 11, how to determine element antenna group 10 in which the combined radiation surface has the rectangular shape elongated in the vertical direction is described. FIG. 11 is a view illustrating an example in which the beam shape can be elongated in the horizontal direction by operating element antenna set 20 used in the array antenna device of the first embodiment. FIG. 11(A) illustrates the state in which element antenna 1 included in operating element antenna set $20_2$ is set to the operating state. FIG. 11(B) illustrates the state in which all element antennas 1 are set to the operating state. FIG. 11(C) illustrates operating element antenna set $20_Z$ in which element antennas 1 having a square arrangement of four each in length and width are set to the operating state as a comparative example. In operating element antenna sets $20_2$ and $20_Z$, the number of element antennas that are set to the operating state is equal at 16.

FIG. 11(D) illustrates the generated beam shape. A beam shape 81 generated by element antenna 1 included in operating element antenna set $20_2$ has an elliptical shape elongated in the horizontal direction. The enlarged beam shape is illustrated in FIG. 11(D). A horizontal length of actual beam shape 81 is shorter than a horizontal length of phased array antenna 50. When the length in the vertical direction is set to be equal to the height of phased array antenna 50, a beam spread in the vertical direction of beam shape 81 in which part of the element antennas are set to the operating state is equal to that of a beam shape 82 in which all the element antennas are set to the operating state. For example, in an antenna installed on the ground, the influence of scattering from the ground or a sea surface can be reduced by making an elliptical shape elongated in the horizontal direction. Because of the small influence of scattering from the ground, the sea surface, or the like, the case where part of the element antennas are set to the operating state can perform calibration with accuracy equal to that of the case where all the element antennas are set to the operating state. A beam shape 83 of operating element antenna set $20_Z$ constituting the combined radiation surface having a substantially square shape is substantially circular. Beam shape 83 has a horizontal length shorter than that of beam shape 81, but has a vertical length longer than that of beam shape 81. For beam shape 83, the influence of scattering from the ground or the like increases, and the accuracy of the calibration decreases.

That the combined radiation surface is long in the vertical direction means that the length in the vertical direction of the combined radiation surface is greater than or equal to a vertical length lower limit. The vertical length lower limit is determined such that the width in the vertical direction of the beam shape is less than or equal to an intended value. When the radiation surface of phased array antenna 50 is horizontally divided, the vertical length of the beam shape generated by the combined radiation surface divided in this way can be set to substantially the same degree as the vertical length of the beam shape in the case where all element antennas 1 are set to the operating state. When a certain extent of spread is allowable for the vertical length of the beam shape, the radiation surface may also be divided in the vertical direction.

Operating element antenna set 20 including the combined radiation surface elongated in the horizontal direction may be used when an obstacle or an object that is preferably not irradiated with the radio wave exists in a side direction.

Operating element antenna set 20 used at the second and subsequent times is determined so as to include both the element antenna group in which the element electric field vector is already calculated and the element antenna group in which the element electric field vector is not yet calculated. For this reason, the processing of obtaining the phase difference and the amplitude ratio based on the common composite electric field vector is simplified. Operating element antenna set 20 may be processed in the order in which operating element antenna set 20 including only the element antenna groups in which the element electric field vector is not yet calculated and operating element antenna set 20 including only the element antenna groups in which the element electric field vector is already calculated are generated for the second time or the subsequent time. In this case, the degree of freedom regarding the order in which operating element antenna set 20 is processed increases. However, when the element antenna groups in which the element electric field vectors based on the different composite electric field vectors are already calculated exist, the processing of setting the phase difference or the amplitude ratio based on the common composite electric field vector becomes complicated.

Although operating element antenna set 20 includes two element antenna groups 10, operating element antenna set 20 may include three or more element antenna groups 10. For example, in the case of three element antenna groups 10, one element antenna group 10 in which the element electric field vector is already calculated may be provided and two element antenna groups 10 in which the element electric field vector is not yet calculated may be provided. The element antenna group may not be determined in advance. When the number of element antennas that are set to the operating state at the same time is less than or equal to the upper limit, and all the element antennas are set to the operating state at least once, the plurality of operating element antenna sets 20 may be such one that the union of the plurality of operating element antenna sets 20 becomes the set of all element antennas 1 by taking repeatedly the union of two operating element antenna sets 20 having the common element antenna. The plurality of operating element antenna sets 20 are required to be determined such that the union of all operating element antenna sets 20 having the common element antennas becomes the set of all element antennas.

It is assumed that the union of two sets can be taken when the two sets have a common element, and that the union of two sets cannot be taken when the two sets do not have a common element. Taking the union of two sets having a common element is called concatenating sets. The concatenated sets can also be concatenated with another set. Operating element antenna sets 20 are necessary to be determined such that all operating element antenna sets 20 are concatenated with each other to become the set of all element antennas. Operating element antenna set 20 is determined with one or a plurality of element antennas 1 as a unit, in which one switching circuit can switch the radiation of the radio wave.

The processing is ended at a time point the element antenna in which the element electric field vector is not yet calculated does not exist. However, the calculation of the element electric field vector may be continued for different operating element antenna set 20. For each element antenna in which the plurality of element electric field vectors are calculated, phase difference ($\Delta jA - \Delta jB$) and amplitude ratio ($cjA - cjB$) are obtained such that the plurality of element electric field vectors match each other, and phase difference r and amplitude ratio $\xi$ between the composite electric field vectors may be determined as the averages of phase differences ($\Delta jA - \Delta jB$) and amplitude ratios ($cjA - cjB$) obtained for the element antennas. The element electric field vectors of the element antennas are converted into phase differences $\Delta jB + \tau$ and amplitude ratios $cjA + \xi$ of the element electric field vector to the common composite electric field vector $E_{OA}$ in consideration of phase difference r and amplitude ratio $\xi$ between the composite electric field vectors, and the element electric field vectors are determined to be the average of phase differences $\Delta jB + \tau$ and amplitude ratios $cjA + \xi$. Consequently, the influence of a measurement error on the phase difference and the amplitude ratio between the element electric field vectors obtained for each element antenna can be decreased.

In the case of obtaining the element electric field vectors more than the necessary minimum number, operating element antenna sets 20 in which one includes the other may exist among the plurality of operating element antenna sets 20. The phase measurement element antenna set may include another phase measurement element antenna set. Although the included phase measurement element antenna set does not contribute to quick adjustment of each element antenna, the included phase measurement element antenna set is effective for decreasing the influence of the measurement error on the element electric field vector.

In processing operating element antenna set 20, all the element electric field vectors are calculated whenever the element electric field vectors can be calculated with respect to the element antennas in which the element electric field vector is already calculated. All the element electric field vectors do not necessarily have to be calculated, but the element electric field vector is required to be calculated again only with respect to at least one of the element antennas in which the element electric field vector is already calculated. The element electric field vector is required to be calculated only with respect to at least one of the element antennas in which the element electric field vector is not yet calculated and that is included in operating element antenna set 20 being processed. It is necessary to calculate the element electric field vector with respect to all the element antennas that are included in operating element antenna set 20 being processed but not included in unprocessed operating element antenna set 20. The plurality of phase measurement element antenna sets corresponding to operating element antenna sets 20 are required to be determined so that the union of the plurality of phase measurement element antenna set 20 become the set of all the element antennas, when the union of the phase measurement element antenna sets in which the common element antenna exists is obtained with respect to all the phase measurement element antenna sets.

Even if there are uncalibrated element antennas, degradation of performance of the array antenna device as a whole may be allowable when a ratio of the uncalibrated element antennas to the whole is small.

Switching circuit 4 switches whether or not the transmission signal is inputted to element antenna 1. In FIG. 1, a mechanical switch is used as switching circuit 4. An electrical switch may be used as switching circuit 4. Switching circuit 4 may be provided in transmitter 5.

Receiving antenna 6 may be either a single antenna or an array antenna. The position at which receiving antenna 6 is installed may be any position at which the radio wave radiated by each element antenna 1 constituting phased array antenna 50 can be received.

Herein, phased array antenna 50 is described as a power transmission antenna. A circulator may be provided between element antenna 1 and power amplifier 2n of phased array antenna 50, and a receiver may be connected to a terminal from which a signal from element antenna 1 of the circulator is outputted, whereby a power transmitting and receiving antenna can be obtained.

In array antenna device 100, one element antenna $1_n$ is provided with one power amplifier $2_n$ and one variable phase shifter $3_n$. The power amplifier and/or the variable phase shifter may be provided corresponding to the plurality of element antennas. The number of corresponding element antennas may vary depending on the power amplifier. The number of corresponding element antennas may vary depending on the variable phase shifter.

The received power level may be measured by changing the phases of radio waves radiated by the plurality of element antennas at the same time. For example, the electric field vectors generated from element antenna $1_1$ and element antenna $1_2$ are calculated from the plurality of received power levels measured by changing the phases of element antenna $1_1$ and element antenna $1_2$ by the same amount at the same time, and the element electric field vector of the element antenna $1_1$ is subtracted as the vector, which allows the element electric field vector of the element antenna $1_2$ to be calculated without changing only the phase of element antenna $1_2$.

The element electric field vector may be calculated by an improved method of the REV method. For example, a method for measuring a received power level while rotating passing phases of at least two element antennas at the same time, performing Fourier series expansion on a change of the measured received power level with respect to a change of the passing phases (phase change amount), and measuring the element electric field vectors of the plurality of element antennas may be adopted as described in Japanese Patent Laid-Open No. 2012-112812, The plurality of variable phase shifter sets are required to be determined so that the phase differences between all the element antennas can be obtained. Each of the plurality of variable phase shifter sets is a set of variable phase shifters provided corresponding to the element antennas included in each of the plurality of operating element antenna sets, and is determined such that the variable phase shifters included in the variable phase shifter sets are different from each other.

Any phase controller may be used as long as the variable phase shifters are controlled with the plurality of different phase change amounts such that the variable phase shifters included in the variable phase shifter set change the phase of the transmission signal by the same phase change amount in the state in which the radiation controller controls the plurality of operation switches according to the corresponding operating element antenna set. Each of the plurality of variable phase shifter sets includes the variable phase shifters being different from each other, the variable phase shifter set being the set of the variable phase shifters provided corresponding to element antennas included in each of the operating element antenna sets.

Any in-set phase-difference calculator may be used as long as the in-set phase difference that is the phase difference between the element electric field vectors, each of the element electric field vectors is generated by the radio wave, the radio wave is radiated by each element antenna included in the phase measurement element antenna set and received by the receiving antenna in the state in which the radiation controller controls the plurality of operation switches according to each of the plurality of operating element antenna sets, is calculated by changing the phase of the transmission signal inputted to the element antenna included in the phase measurement element antenna set that is a set of the element antennas including at least part of the element antennas included in the operating element antenna set and using the received power levels at the plurality of different phase change amounts.

Any in-set amplitude ratio calculator may be used as long as the in-set amplitude ratio that is the amplitude ratio of the element electric field vectors, each of the element electric field vectors generated by each of the element antennas included in the phase measurement element antenna sets is calculated for each phase measurement element antenna set.

The same holds true for another embodiment.

Second Embodiment

A second embodiment is the case where an operating element antenna set 21 is determined such that the combined radiation surface elongated in the vertical direction can be spaced in the horizontal direction. For phased array antenna 50 in which element antennas 1 are arranged as illustrated in FIG. 11, an operating element antenna set $21_n$ is determined as follows.

$21_1=(10_1, 10_5)$
$21_2=(10_2, 10_5)$
$21_3=(10_2, 10_6)$
$21_4=(10_3, 10_6)$
$21_5=(10_3, 10_7)$
$21_6=(10_4, 10_7)$
$21_7=(10_4, 10_8)$

Figure 12:
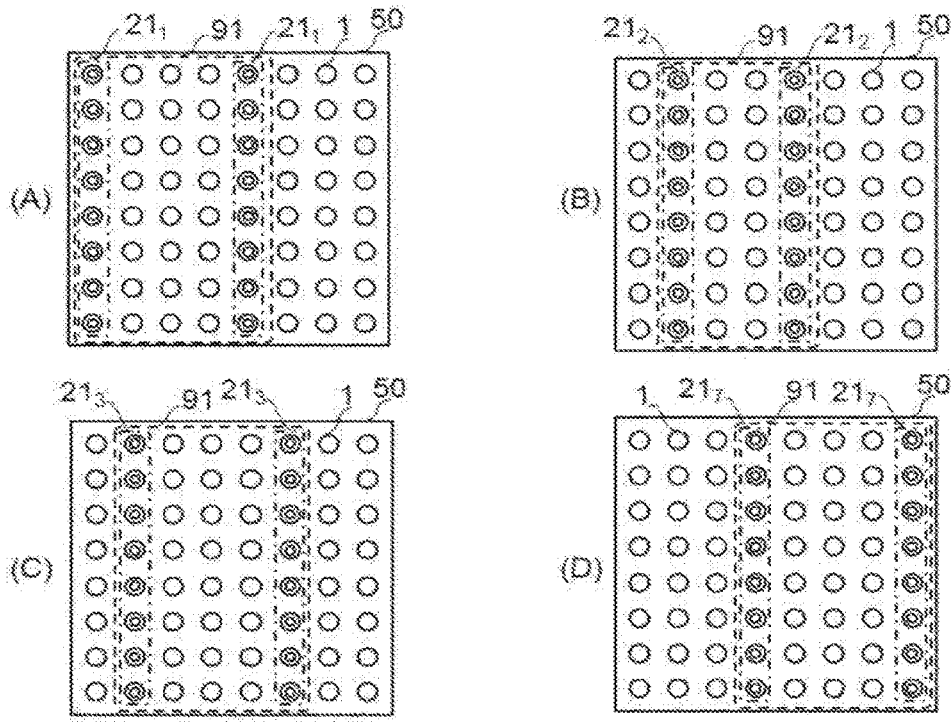
FIG. 12 is a view illustrating the operating state and the non-operating state of an element antenna in an operating element antenna set processed by an array antenna device according to a second embodiment of the present disclosure.

FIG. 12 is a view illustrating an example of operating element antenna set 21 used in the second embodiment. FIG. 12(A) illustrates operating element antenna set $21_1$ used at the first time. FIG. 12(B) illustrates operating element antenna set $21_2$ used at the second time. FIG. 12(C) illustrates operating element antenna set $21_3$ used at the third time. FIG. 12(D) illustrates operating element antenna set $21_7$ used at the seventh time. In FIG. 12, element antenna group 10 is not illustrated in order to make the drawing easy to see. The combined opening surface is separated in operating element antenna set $21_n$.

In the case of FIG. 12, in odd-numbered operating element antenna set 21, three element antenna groups 10 in the non-operating state exist horizontally between two element antenna groups 10 in the operating state. At the even-numbered times, two element antenna groups 10 in the operating state are arranged with two element antenna groups 10 in the non-operating state interposed therebetween. When the combined radiation surface of one element antenna group 10 in the operating state is separated from the combined radiation surface of another element antenna group 10 in the operating state, the combined radiation surface of separated one element antenna group 10 in the operating state is called a partial combined radiation surface (partial combined opening surface). In the case of FIG. 12, there are two partial combined radiation surfaces elongated in the vertical direction. A coverage area 91 that is a smallest convex area surrounding a plurality of partial combined radiation surfaces is indicated by a broken line.

The partial combined radiation surface is a radiation surface obtained in such a manner that radiation surfaces adjacent to each other among radiation surfaces of element antennas 1 included in operating element antenna set 20 are combined. A plurality of partial combined radiation surfaces exist when element antenna 1 having a radiation surface not adjacent to a radiation surface of another element antenna 1 included in operating element antenna set 20 is included in the same operating element antenna set 20.

Figure 13:
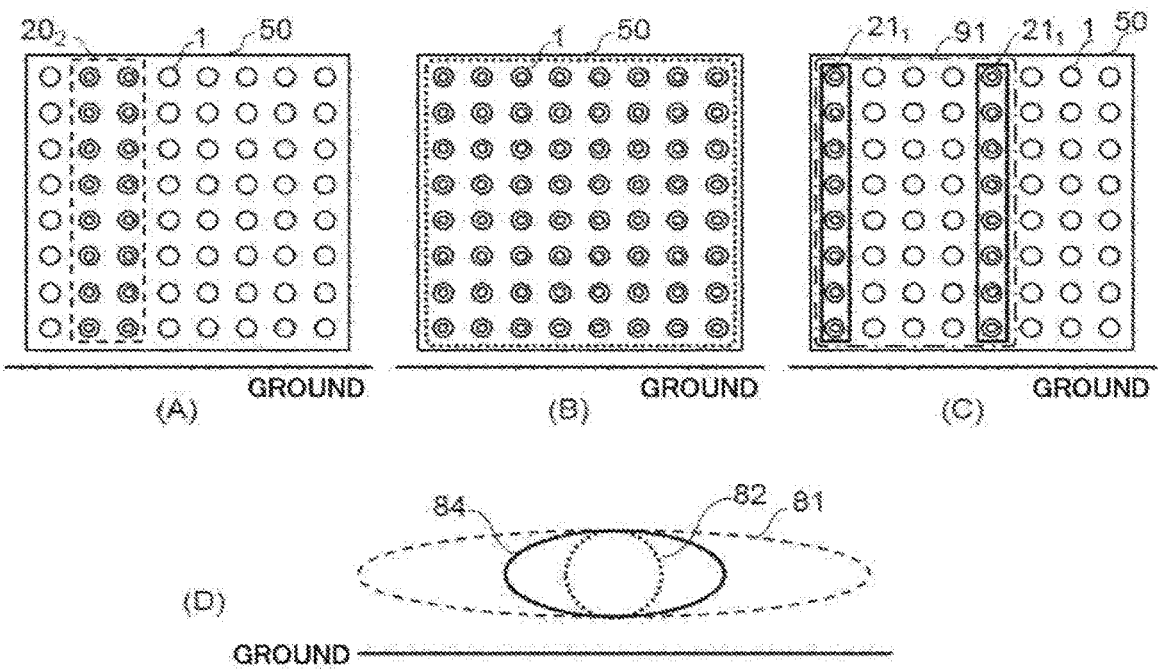
FIG. 13 is a view illustrating an example in which the beam shape can be narrowed in the horizontal direction and a vertical direction by the operating element antenna set used in the array antenna device of the second embodiment.

When horizontally-separated element antenna groups 10 are operated at the same time as illustrated in FIG. 12, the beam shape that is horizontally narrower than the first embodiment can be formed as illustrated in FIG. 13. FIG. 13 is a view illustrating an example in which the beam shape can be narrowed in the horizontal direction by a method for selecting operating element antenna set 21 used in the array antenna device of the second embodiment. FIG. 13(C) illustrates the state in which element antenna 1 included in operating element antenna set $21_1$ is set to the operating state. A beam shape 84 generated by operating element antenna set $21_1$ is represented by a solid line. Beam shape 84 has a vertical length similar to that of beam shape 1 of the first embodiment, and the horizontal length of beam shape 84 is shorter than that of beam shape 1.

The beam shape can be narrowed in both the vertical direction and the horizontal direction by arranging the two partial combined radiation surfaces elongated in the vertical direction apart from each other in the horizontal direction. Consequently, the number of element antennas operated at the same time is limited, and the influence of the object scattering the radio wave in the ground direction and the side direction can be avoided while the restriction on the radiation power is observed. When the element antennas are operated while being horizontally separated from each other, an unnecessary wave called a grating lobe may be generated in the horizontal plane, but this is not a problem because the radiation power is less than or equal to the allowable radiation power.

When a coverage that is a ratio of the horizontal length of coverage area 91 to the horizontal length of the radiation surface of the phased array antenna is greater than or equal to a coverage lower limit, the beam shape can also be thinned in the horizontal direction. The coverage lower limit is determined such that the horizontal length of the beam shape becomes appropriate. The vertical length of the partial combined radiation surface is required to be greater than or equal to the vertical length lower limit.

A free combination of the embodiments or a modification or omission of each embodiment can be made without departing from the scope of the present disclosure.

REFERENCE SIGNS LIST $1_1, 1_2, 1_3, \ldots, 1_N$, 1: element antenna
$2_1, 2_2, 2_3, \ldots, 2_N$, 2: power amplifier $3_1, 3_2, 3_3, \ldots, 3_N$, 3: variable phase shifter
$4_1, 4_2, 4_3, \ldots, 4_N$, 4: switching circuit (operation switch)
5: transmitter
6: receiving antenna
7: receiving circuit (received power level measurer)
$10_1, 10_2, 10_3, \ldots, 10_{Mg}$, 10: element antenna group
$20_1, 20_2, 20_3, \ldots, 20_{Md}, 20_Z$, 20: operating element antenna set
$21_1, 21_2, 21_1, \ldots, 21_7$, 21: operating element antenna set
11: element-electric-field calculation circuit (in-set phase-difference calculator, in-set amplitude ratio calculator)
12: received-power obtainer
13: radiation controller
14: phase controller
15: phase-received-power set generator
16: phase-difference calculator
17: amplitude ratio calculator
18: amplitude phase determiner (phase change amount determiner, amplification factor determiner)
30: phase adjustment control device
31: CPU
32: storage (phase received power set storage)
50: phased array antenna
71: element antenna group definition data
72: operating element antenna set definition data
73: phase shifter set definition data
74: element electric field vector
75: phase difference
76: amplitude ratio
77: phase received power set
81, 82, 83, 84: beam shape
91: coverage range

The invention claimed is:

1. A phase adjustment control device for a phased array antenna, the phase adjustment control device comprising:
a received-power obtainer for obtaining a received power level being a measured level of power of a radio wave received by a receiving antenna disposed at a position where the receiving antenna can receive the radio wave radiated by the phased array antenna, including
a plurality of element antennas for radiating a transmission signal from a transmitter as a radio wave,
a plurality of operation switches for switching between an operating state in which the element antenna radiates the radio wave and a non-operating state in which the element antenna does not radiate the radio wave, the operation switch being provided for each of the element antennas or for every several element antennas, and
a plurality of variable phase shifters for changing a phase of the transmission signal inputted to the element antenna, the variable phase shifter being provided for each of the element antennas or for every several element antennas;
a radiation controller for controlling the plurality of operation switches according to an operating element antenna set such that the element antenna included in the operating element antenna set is set to the operating state while the element antenna not included in the operating element antenna set is set to the non-operating state, the operating antenna set being each of a plurality of operating element antenna sets and being determined to be part of the plurality of element antennas in units of the element antenna being switched between the operating state and the non-operating state by one operation switch,
an in-set phase-difference calculator for calculating an in-set phase difference being a phase difference between element electric field vectors, each of the element electric field vectors being generated by the radio wave, the radio wave being radiated by each of the element antennas included in a phase measurement element antenna set and received by the receiving antenna in a state in which the radiation controller controls the plurality of operation switches according to each of the plurality of operating element antenna sets, the phase measurement element antenna set being a set of the element antennas including at least part of the operating element antenna set, by changing the phase of the transmission signal inputted to the element antenna included in the phase measurement element antenna set and using the received power levels at a plurality of different phase change amounts; and
a phase-difference calculator for calculating a phase difference between the element electric field vectors, the element electric field vectors being generated by the element antennas included in the different phase measurement element antenna sets based on the plurality of in-set phase differences calculated for the plurality of phase measurement element antenna sets, each of the plurality of operating element antenna sets being determined so as to include the element antenna common to another operating element antenna set, each of the phase measurement element antenna sets corresponding to each of the plurality of operating element antenna sets being determined so as to include the element antenna common to another phase measurement element antenna set.

2. The phase adjustment control device for a phased array antenna according to claim 1, wherein the plurality of operating element antenna sets are determined such that a union of the operating element antenna sets having the common element antenna becomes a set of all the element antennas when the union is obtained with respect to all the operating element antenna sets, and
the plurality of phase measurement element antenna sets are determined such that a union of the phase measurement element antenna sets having the common element antenna becomes the set of all the element antennas when the union is obtained with respect to all the phase measurement element antenna sets.

3. The phase adjustment control device for a phased array antenna according to claim 1, wherein each of the plurality of operating element antenna sets is determined such that a vertical length of a combined radiation surface being a sum of radiation surfaces of the element antenna included in the operating element antenna set is greater than or equal to a vertical length lower limit.

4. The phase adjustment control device for a phased array antenna according to claim 1, wherein each of the plurality of operating element antenna sets is determined such that a combined radiation surface being a sum of radiation surfaces of the element antenna included in the operating element antenna set includes a plurality of partial combined radiation surfaces, each of the plurality of partial combined radiation surfaces being a sum of the adjacent radiation surfaces of the element antenna included in the operating element antenna set, such that a vertical length of each of the partial combined radiation surfaces is greater than or equal to a vertical length lower limit, and such that a coverage being a ratio of a horizontal length of a coverage area being a smallest convex area surrounding the plurality of partial combined radiation surfaces to a horizontal length of a radiation surface of the phased array antenna is greater than or equal to a coverage lower limit.

5. The phase adjustment control device for a phased array antenna according to claim 1, further comprising:
an in-set amplitude ratio calculator for calculating an in-set amplitude ratio being an amplitude ratio of the element electric field vectors, each of the element electric field vectors being generated by each of the element antennas included in the phase measurement element antenna set being each of the phase measurement element antenna sets; and
an amplitude ratio calculator for calculating an amplitude ratio of the element electric field vectors, each of the element electric field vectors being generated by each of the element antennas included in the different phase measurement element antenna sets based on a plurality of the in-set amplitude ratios calculated for the plurality of phase measurement element antenna sets.

6. The phase adjustment control device for a phased array antenna according to claim 1, further comprising:
a phase controller for controlling at least one of the variable phase shifters with the plurality of different phase change amounts such that the at least one of the variable phase shifters included in a variable phase shifter set, being each of a plurality of variable phase shifter sets and including the at least one of the variable phase shifters being determined so as to be different from each other, changes the phase of the transmission signal by same phase change amount in a state in which the radiation controller controls the plurality of operation switches according to the operating element antenna set corresponding to the variable phase shifter set, the variable phase shifter set being a set of variable phase shifters provided according to the element antenna included in the phase measurement element antenna set corresponding to the operating element antenna set being each of the plurality of operating element antenna sets; and
a phase-received-power set generator for generating a plurality of phase received power sets, for each of the operating element antenna sets, that are each a set of the received power level in a state in which the phase controller controls the variable phase shifter included in the variable phase shifter set, the variable phase shifter set, and the phase change amount,
wherein the in-set phase-difference calculator calculates the in-set phase difference from the plurality of phase received power sets.

7. The phase adjustment control device for a phased array antenna according to claim 1, further comprising a phase change amount determiner for determining a phase change amount of the variable phase shifter from the phase difference of the element electric field vectors of the element antennas, such that the phased array antenna radiates the radio wave in a predetermined radiation beam pattern.

8. The phase adjustment control device for a phased array antenna according to claim 1, wherein all of the operating element antenna sets are determined to radiate a radio wave within a range of allowable radiation power level when the element antenna included in the operating element antenna set is set to the operating state by the radiation controller.

9. An array antenna device comprising:
a phased array antenna including
a plurality of element antennas for radiating a transmission signal from a transmitter as a radio wave,
a plurality of operation switches for switching between an operating state in which the element antenna radiates the radio wave and a non-operating state in which the element antenna does not radiate the radio wave, the operation switch being provided for each of the element antennas or for every several element antennas, and
a plurality of variable phase shifters for changing a phase of the transmission signal inputted to the element antenna, the variable phase shifter being provided for each of the element antennas or for every several element antennas; and
a phase adjustment controller for a phased array antenna according to claim 1.

10. The array antenna device according to claim 9, wherein the phase adjustment control device further comprising:
a phase change amount determiner for determining a phase change amount of the variable phase shifter from the phase difference of the element electric field vectors of the element antennas, such that the phased array antenna radiates the radio wave in a predetermined radiation beam pattern.

11. The array antenna device according to claim 9, wherein each of the plurality of operating element antenna sets is determined such that a vertical length of a combined radiation surface being a sum of radiation surfaces of the element antenna included in the operating element antenna set is greater than or equal to a vertical length lower limit.

12. The array antenna device according to claim 9, wherein each of the plurality of operating element antenna sets is determined such that a combined radiation surface being a sum of radiation surfaces of the element antenna included in the operating element antenna set includes a plurality of partial combined radiation surfaces, each of the plurality of partial combined radiation surfaces being a sum of the adjacent radiation surfaces of the element antenna included in the operating element antenna set, such that a vertical length of each of the partial combined radiation surfaces is greater than or equal to a vertical length lower limit, and such that a coverage being a ratio of a horizontal length of a coverage area being a smallest convex area surrounding the plurality of partial combined radiation surfaces to a horizontal length of a radiation surface of the phased array antenna is greater than or equal to a coverage lower limit.

13. The array antenna device according to claim 9, wherein all of the operating element antenna sets are determined to radiate a radio wave within a range of allowable radiation power level when the element antenna included in the operating element antenna set is set to the operating state by the radiation controller.

14. An antenna measuring device comprising:
a receiving antenna for receiving a radio wave radiated from a phased array antenna including a plurality of element antennas for radiating a transmission signal from a transmitter as the radio wave, a plurality of operation switches for switching between an operating state in which the element antenna radiates the radio wave and a non-operating state in which the element antenna does not radiate the radio wave, the operation switch being provided for each of the element antennas or for every several element antennas, and a plurality of variable phase shifters for changing a phase of the transmission signal inputted to the element antenna, the variable phase shifter being provided for each of the element antennas or for every several element antennas;

a received power level measurer for measuring a received power level being a measured level of power of the radio wave received by the receiving antenna;

a radiation controller for controlling the plurality of operation switches according to an operating element antenna set such that the element antenna included in the operating element antenna set is set to the operating state while the element antenna not included in the operating element antenna set is set to the non-operating state, the operating antenna set being each of a plurality of operating element antenna sets and being determined to be part of the element antennas in units of the element antenna being switched between the operating state and the non-operating state by one operation switch;

an in-set phase-difference calculator for calculating an in-set phase difference being a phase difference between element electric field vectors, each of the element electric field vectors being generated by the radio wave, the radio wave being radiated by each of the element antennas included in a phase measurement element antenna set and received by the receiving antenna in a state in which the radiation controller controls the plurality of operation switches according to each of the plurality of operating element antenna sets, the phase measurement element antenna set being a set of the element antennas including at least part of the operating element antenna set, by changing the phase of the transmission signal inputted to the element antenna included in the phase measurement element antenna set and by using the received power levels at a plurality of different phase change amounts; and a phase-difference calculator for calculating a phase difference between the element electric field vectors, the element electric field vectors being generated by the element antennas included in the different phase measurement element antenna sets based on the plurality of in-set phase differences calculated for the plurality of phase measurement element antenna sets, each of the plurality of operating element antenna sets being determined so as to include the element antenna common to another operating element antenna set, each of the plurality of phase measurement element antenna sets corresponding to each of the plurality of operating element antenna sets being determined so as to include the element antenna common to another phase measurement element antenna set.

15. The antenna measuring device according to claim 14, further comprising:

a phase controller for controlling at least one of the variable phase shifters with the plurality of different phase change amounts such that the at least one of the variable phase shifters included in a variable phase shifter set being each of a plurality of variable phase shifter sets and including the at least one of the variable phase shifters being determined so as to be different from each other, changes the phase of the transmission signal by an same phase change amount in a state in which the radiation controller controls the plurality of operation switches according to the operating element antenna set corresponding to the variable phase shifter set, the variable phase shifter set being a set of variable phase shifter provided according to the element antenna included in the phase measurement element antenna set corresponding to the operating element antenna set being each of the plurality of operating element antenna sets; and a phase-received-power set generator for generating a plurality of phase received power sets, for each of the operating element antenna sets, that are each a set of the received power level in a state in which the phase controller controls the variable phase shifter included in the variable phase shifter set, the variable phase shifter set, and the phase change amount, wherein the in-set phase-difference calculator calculates the in-set phase difference from the plurality of phase received power sets.

16. The antenna measuring device according to claim 14, wherein all of the operating element antenna sets are determined to radiate a radio wave within a range of allowable radiation power level when the element antenna included in the operating element antenna set is set to the operating state by the radiation controller.

17. A method for adjusting a phase of a phased array antenna that is a phase adjustment method for adjusting a phase of a radio wave radiated by an element antenna included in the phased array antenna including a plurality of element antennas for radiating a transmission signal from a transmitter as a radio wave, a plurality of operation switches for switching between an operating state in which the element antenna radiates the radio wave and a non-operating state in which the element antenna does not radiate the radio wave, the operation switch being provided for each of the element antennas or for every several element antennas, and a plurality of variable phase shifters for changing a phase of the transmission signal inputted to the element antenna, the variable phase shifter being provided for each of the element antennas or for every several element antennas, the method comprising:

a radiation control step of controlling the plurality of operation switches according to an operating element antenna set such that the element antenna included in the operating element antenna set is set to the operating state while the element antenna not included in the operating element antenna set is set to the non-operating state, the operating antenna set being each of a plurality of operating element antenna sets and being determined to be part of the plurality of element antennas in units of the element antenna being switched between the operating state and the non-operating state by one operation switch;

an in-set phase difference calculation step of calculating an in-set phase difference being a phase difference between element electric field vectors, each of the element electric field vectors being generated by the radio wave, the radio wave being radiated by each of the element antennas included in a phase measurement element antenna set and received by the receiving antenna in a state in which the plurality of operation switches are controlled in the radiation control step according to each of the plurality of operating element antenna sets, the phase measurement element antenna set being a set of the element antennas including at least part of the operating element antenna set, by changing the phase of the transmission signal inputted to the element antenna included in the phase measurement element antenna set, and using the received power levels being measured levels of power of the radio waves received by the receiving antenna disposed at a position where the receiving antenna can receive the radio wave radiated by phased array antenna at a plurality of different phase change amounts; and a phase difference calculation step of calculating a phase difference between the element electric field vectors, the element electric field vectors being generated by the element antennas included in the different phase measurement element antenna sets based on the plurality of in-set phase differences calculated for the plurality of phase measurement element antenna sets, each of the plurality of operating element antenna sets being determined so as to include the element antenna common to another operating element antenna set, each of the plurality of phase measurement element antenna sets corresponding to each of the plurality of operating element antenna sets being determined so as to include the element antenna common to another phase measurement element antenna set.

18. The method for adjusting a phase of a phased array antenna according to claim 17, wherein the plurality of operating element antenna sets are determined such that a union of the operating element antenna sets having the common element antenna becomes a set of all the element antennas when the union is obtained with respect to all the operating element antenna sets, and the plurality of phase measurement element antenna sets are determined such that a union of the phase measurement element antenna sets having the common element antenna becomes the set of all the element antennas when the union is obtained with respect to all the phase measurement element antenna sets.

19. The method for adjusting a phase of a phased array antenna according to claim 17, wherein each of the plurality of operating element antenna sets is determined such that a vertical length of a combined radiation surface being a sum of radiation surfaces of the element antenna included in the operating element antenna set is greater than or equal to a vertical length lower limit.

20. The method for adjusting a phase of a phased array antenna according to claim 17, wherein each of the plurality of operating element antenna sets is determined such that a combined radiation surface being a sum of radiation surfaces of the element antenna included in the operating element antenna set includes a plurality of partial combined radiation surfaces, each of the plurality of partial combined radiation surfaces being a sum of the adjacent radiation surfaces of the element antenna included in the operating element antenna set, such that a vertical length of each of the partial combined radiation surfaces is greater than or equal to a vertical length lower limit, and such that a coverage being a ratio of a horizontal length of a coverage area being a smallest convex area surrounding the plurality of partial combined radiation surfaces to a horizontal length of a radiation surface of the phased array antenna is greater than or equal to a coverage lower limit.

21. The method for adjusting a phase of a phased array antenna according to claim 17, further comprising:

an in-set amplitude ratio calculation step of calculating an in-set amplitude ratio being an amplitude ratio of the element electric field vectors, each of the element electric field vectors being generated by each of the element antennas included in the phase measurement element antenna set being each of the phase measurement element antenna sets; and an amplitude ratio calculation step of calculating an amplitude ratio of the element electric field vectors, each of the element electric field vectors being generated by each of the element antennas included in the different phase measurement element antenna sets based on a plurality of the in-set amplitude ratios calculated for the plurality of phase measurement element antenna sets.

22. The method for adjusting a phase of a phased array antenna according to claim 17, further comprising:

a phase control step of controlling at least one of the variable phase shifters with the plurality of different phase change amounts such that the at least one of the variable phase shifters included in a variable phase shifter set, being each of a plurality of variable phase shifter sets and including the at least one of the variable phase shifters being determined so as to be different from each other, changes the phase of the transmission signal by same phase change amount in a state in which the plurality of operation switches are controlled in the radiation step according to the operating element antenna set corresponding to the variable phase shifter set, the variable phase shifter set being a set of variable phase shifter provided according to the element antenna included in the phase measurement element antenna set corresponding to the operating element antenna set being each of the plurality of operating element antenna sets; and a phase-received-power set generation step of generating a plurality of phase received power sets that are each a set of the received power level in a state in which the variable phase shifter included in the variable phase shifter set is controlled in the phase control step, the variable phase shifter set, and the phase change amount for each of the operating element antenna sets, wherein the in-set phase difference is calculated from the plurality of phase received power sets in the in-set phase difference calculation step.

23. The method for adjusting a phase of a phased array antenna according to claim 17, wherein all of the operating element antenna sets are determined to radiate a radio wave within a range of allowable radiation power level when the element antenna included in the operating element antenna set is set to the operating state by the radiation control step.

* * * * *